United States Patent
Minami et al.

(10) Patent No.: US 8,476,628 B2
(45) Date of Patent: Jul. 2, 2013

(54) DEVICE USING OXIDE SEMICONDUCTOR, DISPLAY DEVICE, AND ELECTRONIC APPARATUS

(75) Inventors: Tetsuo Minami, Tokyo (JP); Katsuhide Uchino, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 13/317,373

(22) Filed: Oct. 17, 2011

(65) Prior Publication Data

US 2012/0146036 A1    Jun. 14, 2012

(30) Foreign Application Priority Data

Dec. 13, 2010    (JP) ................................. 2010-276939

(51) Int. Cl.
*H01L 29/12*    (2006.01)
*G09G 3/16*    (2006.01)

(52) U.S. Cl.
USPC .............. 257/43; 257/E29.389; 257/E29.296; 345/48

(58) Field of Classification Search
CPC ....... H01L 29/7869; H01L 21/16; H01L 21/00; G02F 1/1523; G02F 1/292; G02F 1/31
USPC ........ 257/43, 59, E29.389, E29.296; 345/48, 345/55, 76, 204
See application file for complete search history.

(56) References Cited

U.S. PATENT DOCUMENTS
2006/0091793 A1* 5/2006 Baude et al. ................ 313/506

FOREIGN PATENT DOCUMENTS
JP    2010-114413    5/2010

* cited by examiner

*Primary Examiner* — Nikolay Yushin
(74) *Attorney, Agent, or Firm* — Rader, Fishman & Grauer PLLC

(57) ABSTRACT

Disclosed herein is a device using an oxide semiconductor, the device including a circuit part configured to include a thin film transistor using the oxide semiconductor as a channel material, wherein the circuit part has a lower interconnect, an upper interconnect, and an interlayer insulating film, the interlayer insulating film includes an oxide semiconductor layer and a channel protective layer, and the channel protective layer is interposed between an outer circumferential surface of a rising part of the oxide semiconductor layer corresponding to thickness of the lower interconnect and the upper interconnect.

12 Claims, 21 Drawing Sheets

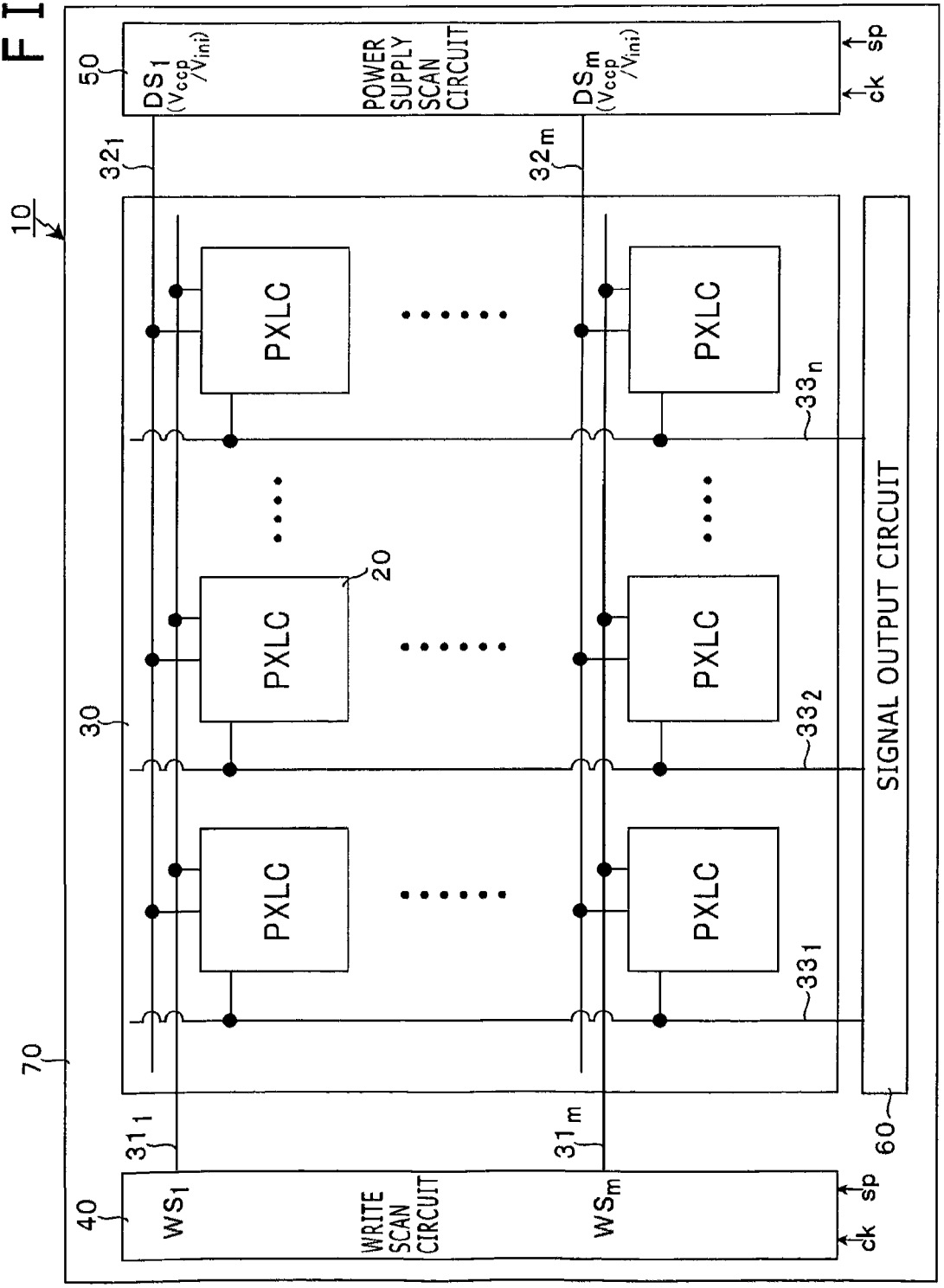

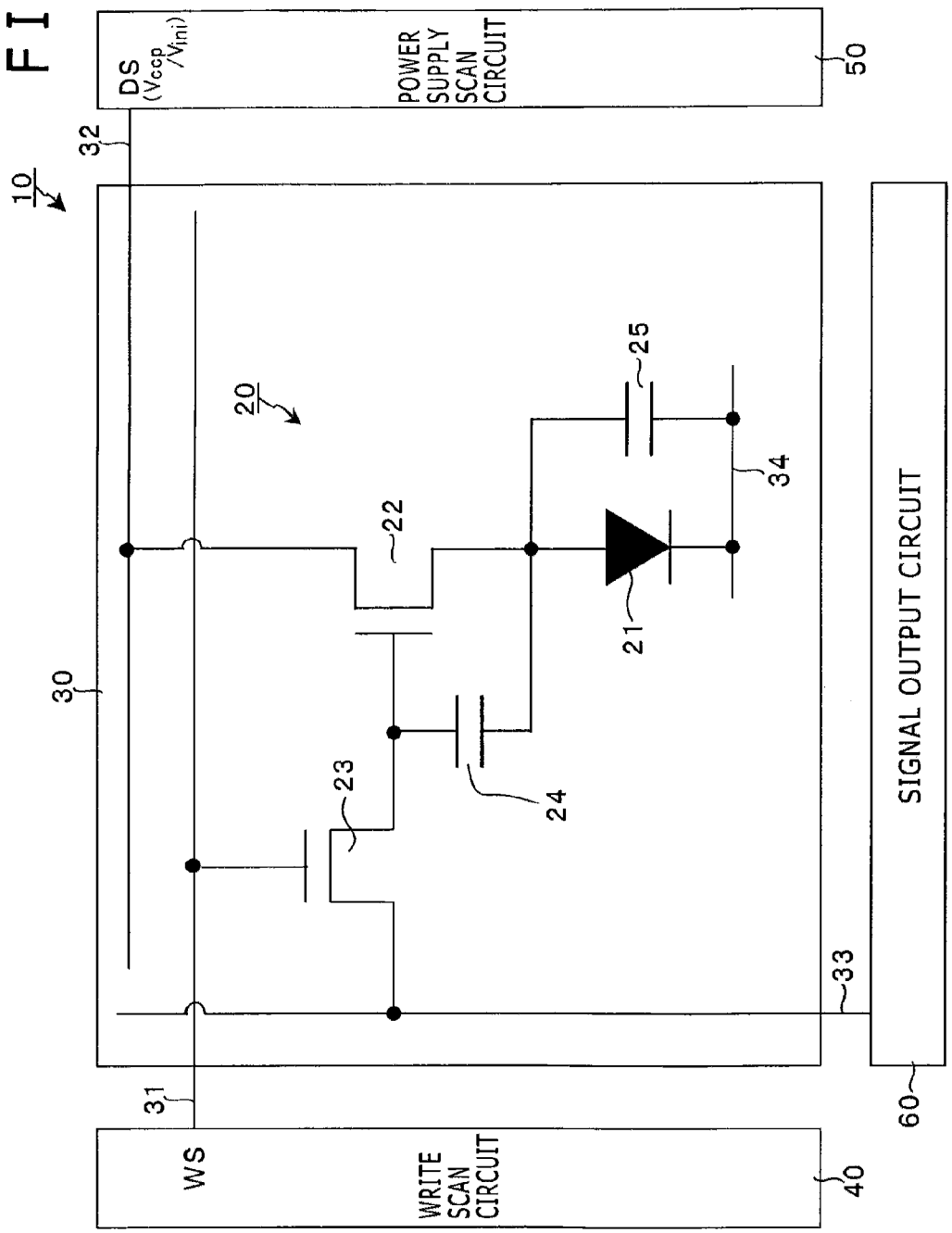

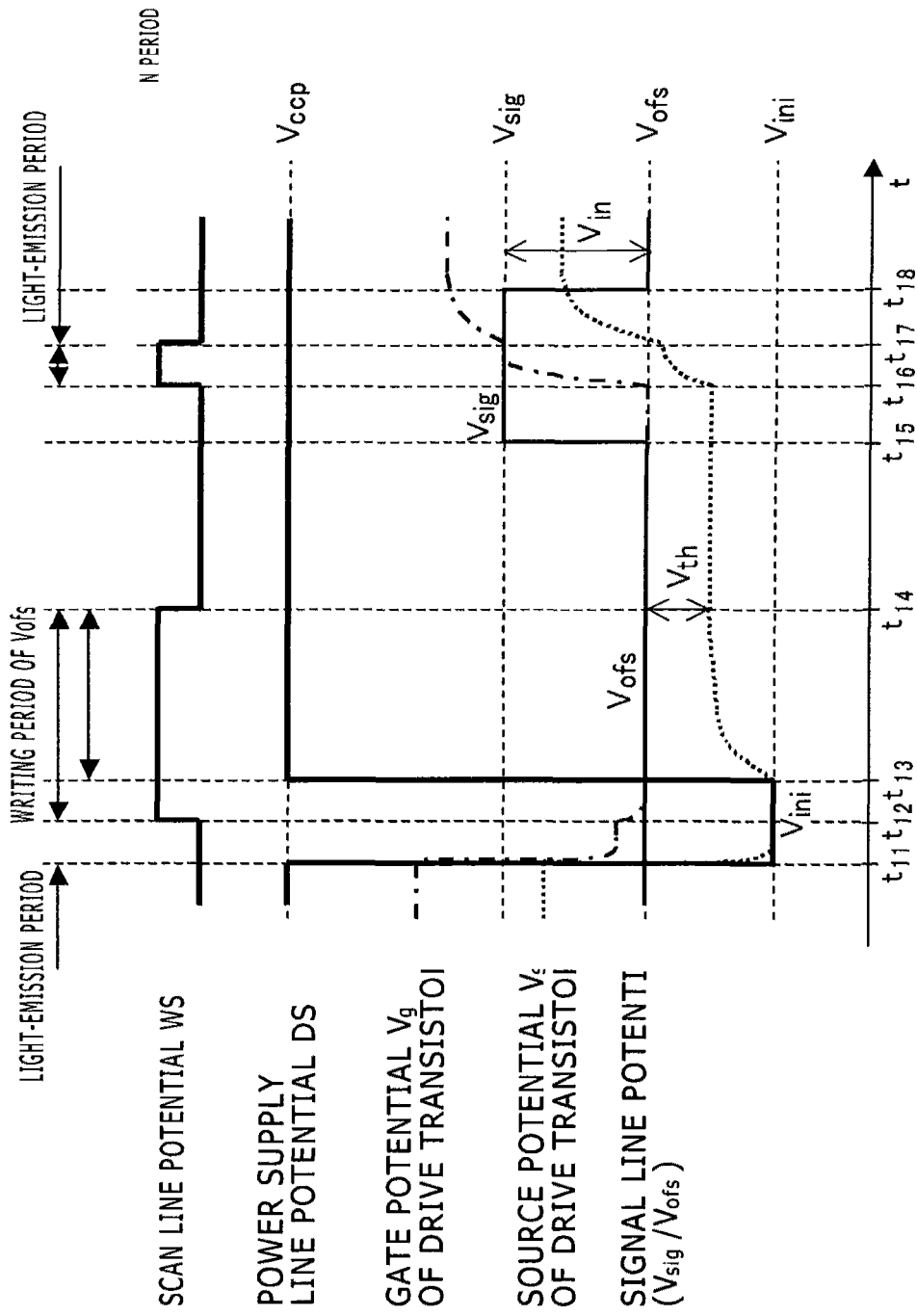

BEFORE t=t₁₁ t=t₁₁ t=t₁₂ t=t₁₃

$t=t_{14}$ $t=t_{15}$ $t=t_{16}$ $t=t_{17}$

FIG.14
STEP 1
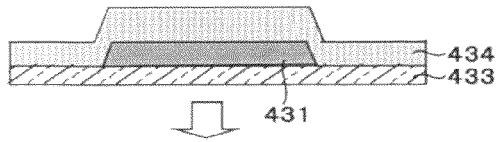
STEP 2
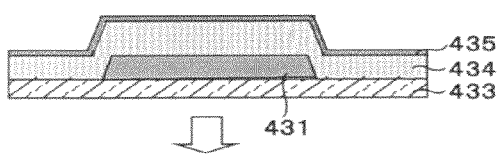
STEP 3
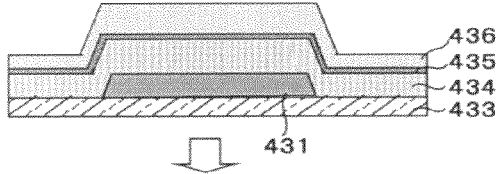
STEP 4
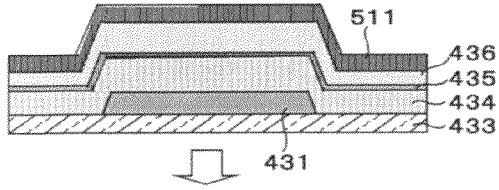
STEP 5
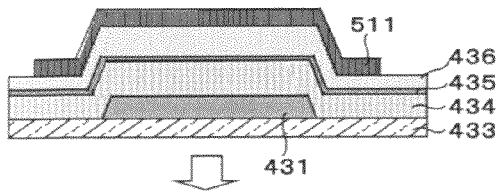
STEP 6
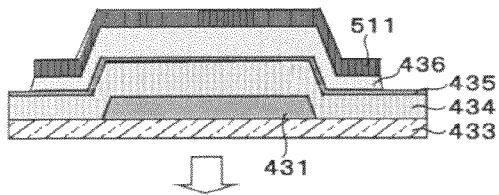
STEP 7
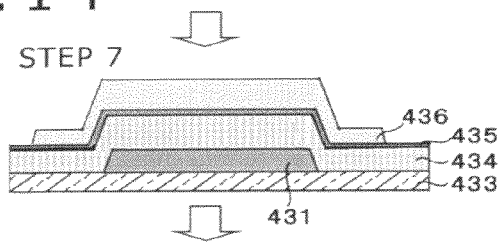
STEP 8
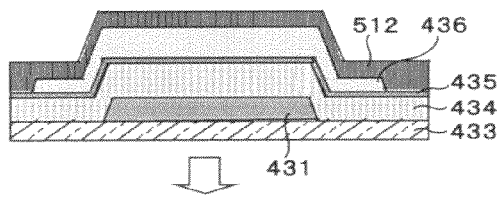
STEP 9
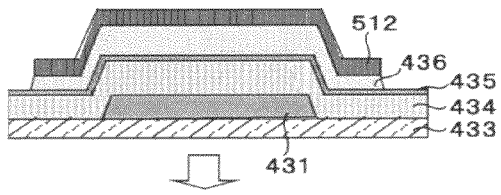
STEP 10
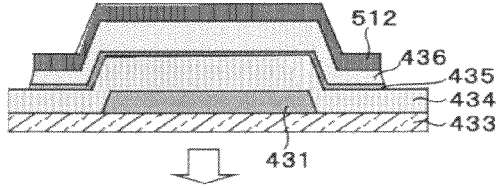
STEP 11
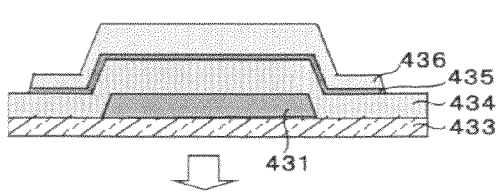
STEP 12
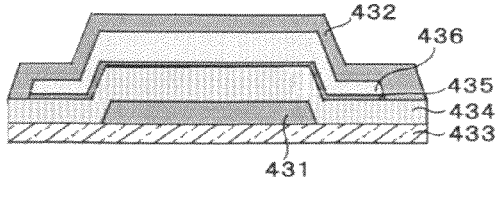

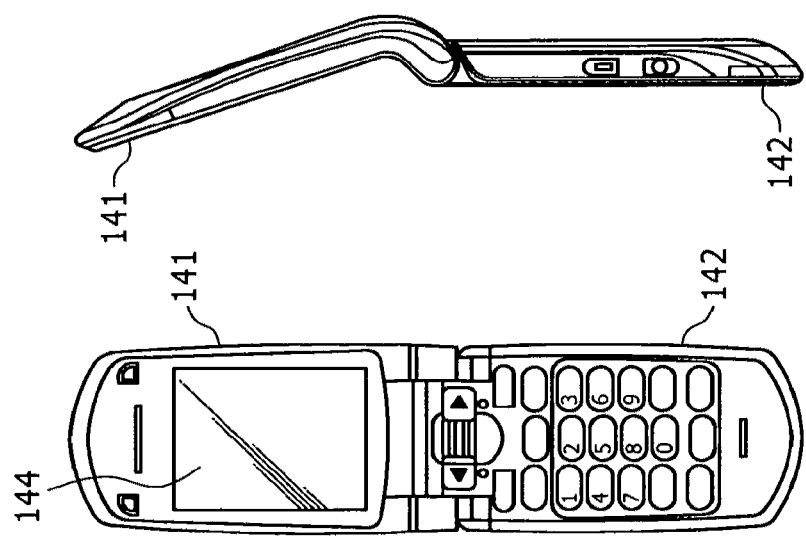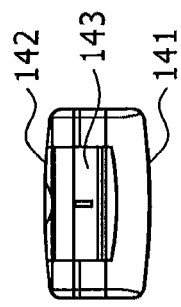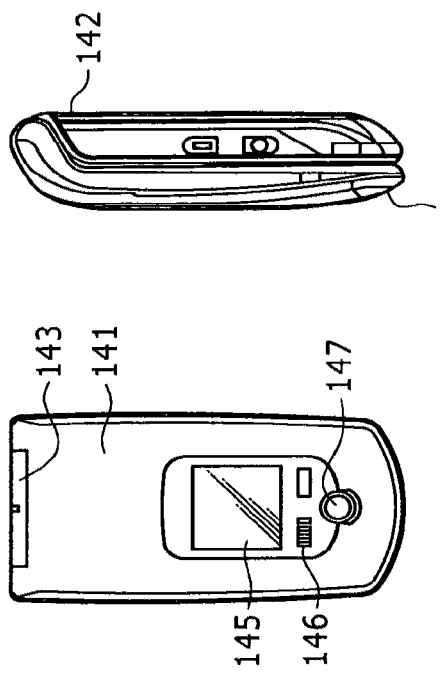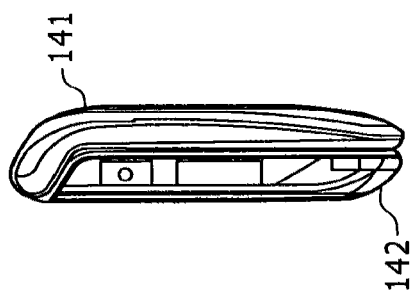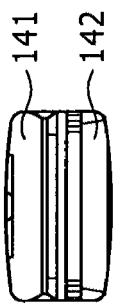

DEVICE USING OXIDE SEMICONDUCTOR, DISPLAY DEVICE, AND ELECTRONIC APPARATUS

BACKGROUND

The present disclosure relates to devices using an oxide semiconductor, display devices, and electronic apparatus, and particularly to a device using a thin film transistor including an oxide semiconductor as its channel material, a display device using the thin film transistor, and electronic apparatus having the display device.

In recent years, a thin film transistor (TFT) using a semiconductor composed mainly of an oxide (hereinafter, referred to as "oxide semiconductor") as its channel material is attracting attention. It is known that the thin film transistor using the oxide semiconductor as its channel material has higher carrier mobility and exhibits more excellent semiconductor characteristics compared with the thin film transistor using amorphous silicon as its channel material, used in existing liquid crystal display devices and so forth.

On the other hand, the amorphous silicon easily allows achievement of a large-size screen of the display panel although it has low carrier mobility. The oxide semiconductor can be fabricated by the same process as that of the amorphous silicon. Therefore, the oxide semiconductor also easily allows achievement of a large-size screen of the display panel similarly to the amorphous silicon. In addition, the carrier mobility of the oxide semiconductor is comparatively high. Thus, a circuit part using a thin film transistor including the oxide semiconductor as its channel material can be mounted on the display panel.

For this reason, development is promoted and various proposals have been made about a display device using a thin film transistor including the oxide semiconductor as its channel material as the thin film transistor configuring the pixel circuit and the circuit part (drive circuit part) around the pixel array part in the display device (refer to e.g. Japanese Patent Laid-Open No. 2010-114413).

SUMMARY

In the display device, a situation in which interconnects intersect each other inevitably occurs in the circuit part around the pixel array part. Therefore, a place where an upper interconnect crosses over a lower interconnect inevitably exists. For this situation, generally the film thickness of the interlayer insulating film is set large at the part where the interconnects intersect each other (hereinafter, referred to as "interconnect intersection part") in order to prevent interlayer short circuit at the place where the lower interconnect and the upper interconnect intersect each other.

In the case of configuring the circuit part by using a thin film transistor including the oxide semiconductor as its channel material, an oxide semiconductor layer that is the channel layer of the thin film transistor and a channel protective film are formed also at the interconnect intersection part as the interlayer insulating film in the same process.

However, the electrical characteristics of the oxide semiconductor deteriorate when the oxygen comes out of the oxide semiconductor over time. Specifically, the electrical characteristics change in such a direction that the electrical conductivity becomes higher (i.e. the oxygen semiconductor becomes closer to a conductor). If the oxide semiconductor becomes close to a conductor, the oxide semiconductor layer is electrically short-circuited with the upper interconnect. So, the oxide semiconductor layer itself and the channel protective film between the oxide semiconductor layer and the upper interconnect become nonfunctional as the interlayer insulating film and only the insulating film between the oxide semiconductor layer and the lower interconnect functions as the interlayer insulating film. As a result, the breakdown voltage between the lower interconnect and the upper interconnect at the interconnect intersection part is lowered.

Although a problem of the related art is described above by taking the display device as an example, this problem applies not only to the display device but also to the overall devices using the oxide semiconductor.

There is a need for a technique to provide a device using an oxide semiconductor, a display device, and electronic apparatus in which, for use of a thin film transistor including an oxide semiconductor as its channel material, breakdown voltage lowering in association with change in the characteristics of the oxide semiconductor over time at the interconnect intersection part is prevented.

According to an embodiment of the present disclosure, there is provided a device using an oxide semiconductor. The device includes a circuit part configured to include a thin film transistor using the oxide semiconductor as a channel material. In the device, the circuit part has a lower interconnect formed in the same process as that of the gate electrode of the thin film transistor, an upper interconnect intersecting the lower interconnect, and an interlayer insulating film provided between the lower interconnect and the upper interconnect. Furthermore, the interlayer insulating film includes an oxide semiconductor layer and a channel protective layer stacked over the lower interconnect with the intermediary of a gate insulating film in the same processes as those of a channel layer and a channel protective layer of the thin film transistor. Moreover, the channel protective layer is interposed between the outer circumferential surface of a rising part of the oxide semiconductor layer corresponding to the thickness of the lower interconnect and the upper interconnect.

In the device using an oxide semiconductor with the above-described configuration, in forming the interlayer insulating film having a large film thickness at a place where the lower interconnect intersects the upper interconnect, i.e. an interconnect intersection part, the oxide semiconductor layer and the channel protective layer are stacked in the same processes as those of the channel layer and channel protective layer of the thin film transistor. At this time, the channel protective layer is interposed between the outer circumferential surface of the rising part of the oxide semiconductor layer corresponding to the thickness of the lower interconnect and the upper interconnect. Due to this feature, the oxide semiconductor layer is not electrically short-circuited with the upper interconnect at its outer circumferential surface even when the oxide semiconductor becomes close to a conductor due to change in the characteristics of the oxide semiconductor over time, specifically due to the deterioration of the electrical characteristics attributed to removal of the oxygen over time. That is, in the interlayer insulating film at the interconnect intersection part, the problem of the deterioration of the electrical characteristics attributed to change in the characteristics of the oxide semiconductor over time does not occur.

According to the embodiment of the present disclosure, in a device using a thin film transistor including an oxide semiconductor as its channel material, the problem of change in the characteristics of the oxide semiconductor over time does not occur in the interlayer insulating film at the interconnect intersection part and therefore the breakdown voltage between upper and lower interconnects is not lowered at the interconnect intersection part.

BRIEF DESCRIPTION OF THE DRAWINGS

FIG. 1 is a system configuration diagram showing the schematic configuration of an organic EL display device to which an embodiment of the present disclosure is applied;

FIG. 2 is a circuit diagram showing one example of the circuit configuration of a pixel of the organic EL display device to which the embodiment of the present disclosure is applied;

FIG. 3 is a timing waveform diagram for explaining the basic circuit operation of the organic EL display device to which the embodiment of the present disclosure is applied;

FIG. 6A shows one example of the configuration of the write scan circuit and FIG. 6B shows a circuit example of a shift register circuit included in the write scan circuit;

FIG. 7A shows one example of the circuit configuration and FIG. 7B shows the respective waveforms of an input pulse signal $INV_{in}$ and an output pulse signal $INV_{out}$;

FIG. 9A shows the interconnect structure of a circuit part having the interconnect intersection part, FIG. 9B shows an enlarged planar pattern of the interconnect intersection part, and FIG. 9C shows a section along line X-X' in FIG. 9B;

FIG. 10A shows the electrical state before removal of the oxygen and FIG. 10B shows the electrical state after removal of the oxygen;

FIG. 11A shows an enlarged planar pattern of the interconnect intersection part and FIG. 11B shows a section along line A-A' in FIG. 11A;

FIG. 12A shows an enlarged planar pattern of the interconnect intersection part and FIG. 12B shows a section along line B-B' in FIG. 12A;

FIG. 13A shows an enlarged planar pattern of the interconnect intersection part and FIG. 13B shows a section along line C-C' in FIG. 13A;

FIG. 14 is a step diagram showing a step flow about the manufacturing process of the interlayer insulating film according to form example 1 of the first embodiment;

FIG. 17A is a perspective view of the front side and FIG. 17B is a perspective view of the back side;

FIGS. 20A to 20G are appearance diagrams showing a cellular phone to which the embodiment of the present disclosure is applied: FIG. 20A is a front view of the opened state, FIG. 20B is a side view of the opened state, FIG. 20C is a front view of the closed state, FIG. 20D is a left side view, FIG. 20E is a right side view, FIG. 20F is a top view, and FIG. 20G is a bottom view.

DETAILED DESCRIPTION OF THE PREFERRED EMBODIMENTS

Figure 4A:
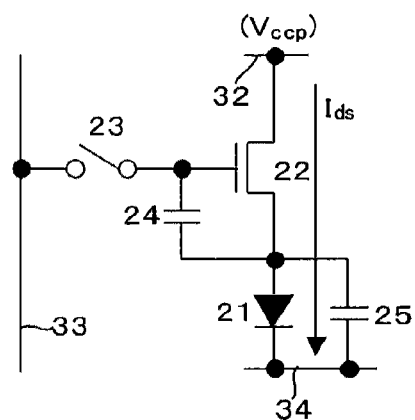
FIGS. 4A to 4H are operation explanatory diagrams of the basic circuit operation of the organic EL display device to which the embodiment of the present disclosure is applied.

Modes for carrying out the present disclosure (hereinafter, referred to as "embodiments") will be described in detail below with reference to the drawings. The order of the description is as follows.

1. Organic EL Display Device to Which Embodiment of the Present Disclosure Is Applied
 1-1. System Configuration
 1-2. Basic Circuit Operation
 1-3. Configuration Examples of Drive Circuit Parts
2. First Embodiment (Interlayer Insulating Film Including Oxide Semiconductor Layer)
 2-1. Form Example 1
 2-2. Form Example 2
3. Second Embodiment (Interlayer Insulating Film Including No Oxide Semiconductor Layer)
4. Manufacturing Process
 4-1. Manufacturing Process 1
 4-2. Manufacturing Process 2
5. Modification Example
6. Electronic Apparatus

1. Organic EL Display Device to which Embodiment of the Present Disclosure is Applied

1-1. System Configuration

FIG. 1 is a system configuration diagram showing the schematic configuration of an active-matrix display device to which an embodiment of the present disclosure is applied.

The active-matrix display device is a display device that controls the current flowing through an electrooptical element by an active element provided in the same pixel as that of this electrooptical element, e.g. an insulated-gate field effect transistor. As the insulated-gate field effect transistor, generally a thin film transistor (TFT) is used.

The following description will be made by taking as an example an active-matrix organic EL display device using a current-driven electrooptical element whose light emission luminance changes depending on the value of the current flowing through the element, e.g. an organic EL element, as the light emitting element of the pixel (pixel circuit).

As shown in FIG. 1, an organic EL display device 10 according to the present application example has a pixel array part 30 in which plural pixels 20 including organic EL elements are two-dimensionally arranged in a matrix and drive circuit parts disposed around this pixel array part 30. The drive circuit parts are composed of a write scan circuit 40, a power supply scan circuit 50, a signal output circuit 60, and so forth and drive the respective pixels 20 of the pixel array part 30.

If the organic EL display device 10 is capable of color displaying, one pixel (unit pixel) is composed of plural sub-pixels and each of the sub-pixels is equivalent to the pixel 20 in FIG. 1. Specifically, in the display device capable of color displaying, one pixel is composed of e.g. three sub-pixels, a sub-pixel to emit red light (R), a sub-pixel to emit green light (G), and a sub-pixel to emit blue light (B).

However, the configuration of one pixel is not limited to the combination of sub-pixels of three primary colors of RGB and it is also possible to configure one pixel by further adding a sub-pixel of one color or plural colors to the sub-pixels of three primary colors. Specifically, for example it is also possible to configure one pixel by adding a sub-pixel to emit white light (W) for luminance enhancement and to configure one pixel by adding at least one sub-pixel to emit complementary-color light for enlargement of the color reproduction range.

The pixel array part 30 includes scan lines $31_1$ to $31_m$, power supply lines $32_1$ to $32_m$, and signal lines $33_1$ to $33_n$. For the arrangement of the pixels 20 on m rows and n columns, the scan lines $31_1$ to $31_m$ and the power supply lines $32_1$ to $32_m$ are wired along the row direction (arrangement direction of the pixels on the pixel row) on each pixel row basis. The signal lines $33_1$ to $33_n$ are wired along the column direction (arrangement direction of the pixels on the pixel column) on each pixel column basis.

Each of the scan lines $31_1$ to $31_m$ is connected to the output terminal of the write scan circuit 40 for the corresponding row. Each of the power supply lines $32_1$ to $32_m$ is connected to the output terminal of the power supply scan circuit 50 for the corresponding row. Each of the signal lines $33_1$ to $33_n$ is connected to the output terminal of the signal output circuit 60 for the corresponding column.

The pixel array part 30 is normally formed on a transparent insulating substrate such as a glass substrate. Thus, the organic EL display device 10 has a planar-type (flat-type) panel structure. The drive circuit of the respective pixels 20 of the pixel array part 30 can be formed by using a thin film transistor including an oxide semiconductor as its channel material (oxide semiconductor TFT) as described later. Furthermore, the write scan circuit 40, the power supply scan circuit 50, and the signal output circuit 60 are also formed by using the oxide semiconductor TFT and thereby can be mounted on a display panel (substrate) 70, which forms the pixel array part 30, as shown in FIG. 1.

The write scan circuit 40 is configured with a shift register circuit that sequentially shifts (transfers) a start pulse sp in synchronization with a clock pulse ck, and so forth (details of the specific configuration of the write scan circuit 40 will be described later). In writing of a video signal to the respective pixels 20 of the pixel array part 30, this write scan circuit 40 sequentially supplies a write scan signal WS ($WS_1$ to $WS_m$) to the scan line 31 ($31_1$ to $31_m$) to thereby scan (line-sequentially scan) the respective pixels 20 of the pixel array part 30 in turn on a row-by-row basis.

The power supply scan circuit 50 is configured with a shift register circuit that sequentially shifts the start pulse sp in synchronization with the clock pulse ck, and so forth. This power supply scan circuit 50 supplies a supply potential DS ($DS_1$ to $DS_m$) capable of being switched between a first supply potential $V_{ccp}$ and a second supply potential $V_{ini}$ lower than the first supply potential $V_{ccp}$ to the power supply line 32 ($32_1$ to $32_n$) in synchronization with the line-sequential scanning by the write scan circuit 40. As described later, light-emission/non-light-emission of the pixel 20 is controlled by the switching of $V_{ccp}/V_{ini}$ of the supply potential DS.

The signal output circuit 60 selectively outputs a reference potential $V_{ofs}$ and a signal voltage $V_{sig}$ of the video signal corresponding to luminance information supplied from a signal supply source (not shown) (hereinafter, it will be often referred to simply as "signal voltage"). The reference potential $V_{ofs}$ is the potential serving as the basis of the signal voltage $V_{sig}$ of the video signal (e.g. potential equivalent to the black level of the video signal) and is used in threshold correction processing to be described later.

The signal voltage $V_{sig}$/reference potential $V_{ofs}$ output from the signal output circuit 60 is written to the respective pixels 20 of the pixel array part 30 via the signal line 33 ($33_1$ to $33_n$) in units of the pixel row selected by scanning by the write scan circuit 40. That is, the signal output circuit 60 employs the driving form of line-sequential writing to write the signal voltage $V_{sig}$ on each row (line) basis.

(Pixel Circuit)

FIG. 2 is a circuit diagram showing one example of the specific circuit configuration of the pixel (pixel circuit) 20. The light emitting part of the pixel 20 is formed of an organic EL element 21, which is a current-driven electrooptical element whose light emission luminance changes depending on the value of the current flowing through the element.

As shown in FIG. 2, the pixel 20 is configured with the organic EL element 21 and the drive circuit that drives the organic EL element 21 by applying a current to the organic EL element 21. The cathode electrode of the organic EL element 21 is connected to a common power supply line 34 wired in common to all pixels 20 (so-called blanket interconnect).

The drive circuit to drive the organic EL element 21 has a drive transistor 22, a write transistor 23, hold capacitance 24, and auxiliary capacitance 25. N-channel TFTs can be used as the drive transistor 22 and the write transistor 23. However, this combination of the conductivity type of the drive transistor 22 and the write transistor 23 is merely one example and the combination is not limited thereto.

One electrode (source/drain electrode) of the drive transistor 22 is connected to the anode electrode of the organic EL element 21 and the other electrode (drain/source electrode) is connected to the power supply line 32 ($32_1$ to $32_m$).

One electrode (source/drain electrode) of the write transistor 23 is connected to the signal line 33 ($33_1$ to $33_n$) and the other electrode (drain/source electrode) is connected to the gate electrode of the drive transistor 22. The gate electrode of the write transistor 23 is connected to the scan line 31 ($31_1$ to $31_m$).

In the drive transistor 22 and the write transistor 23, one electrode refers to the metal interconnect electrically connected to the source/drain region and the other electrode refers to the metal interconnect electrically connected to the drain/source region. Depending on the potential relationship between one electrode and the other electrode, possibly one electrode serves as either the source electrode or the drain electrode and the other electrode serves as either the drain electrode or the source electrode.

One electrode of the hold capacitance 24 is connected to the gate electrode of the drive transistor 22 and the other electrode is connected to one electrode of the drive transistor 22 and the anode electrode of the organic EL element 21.

One electrode of the auxiliary capacitance 25 is connected to the anode electrode of the organic EL element 21 and the other electrode is connected to the common power supply line 34. This auxiliary capacitance 25 is provided according to need in order to compensate for insufficiency of the capacitance of the organic EL element 21 and enhance the gain of writing of the video signal to the hold capacitance 24. That is, the auxiliary capacitance 25 is not an essential constituent element and can be omitted if the equivalent capacitance of the organic EL element 21 is sufficiently high.

In this configuration, the other electrode of the auxiliary capacitance 25 is connected to the common power supply line 34. However, the connection subject of the other electrode is not limited to the common power supply line 34 as long as the connection subject is a node at a fixed potential. Connecting the other electrode of the auxiliary capacitance 25 to the node of a fixed potential allows achievement of the desired aim of compensating for insufficiency of the capacitance of the organic. EL element 21 and enhancing the gain of writing of the video signal to the hold capacitance 24.

In the pixel 20 having the above-described configuration, the write transistor 23 becomes the conductive state in response to the High-active write scan signal WS applied from the write scan circuit 40 to the gate electrode via the scan line 31. Thereby, the write transistor 23 performs sampling of the signal voltage $V_{sig}$ of the video signal corresponding to luminance information or the reference potential $V_{ofs}$, supplied from the signal output circuit 60 via the signal line 33, and writes it in the pixel 20. This written signal voltage $V_{sig}$ or reference potential $V_{ofs}$ is applied to the gate electrode of the drive transistor 22 and held in the hold capacitance 24.

When the supply potential DS of the power supply line 32 ($32_1$ to $32_m$) is the first supply potential $V_{ccp}$, one electrode of the drive transistor 22 serves as the drain electrode and the other electrode serves as the source electrode and the drive transistor 22 operates in the saturation region. Thereby, the drive transistor 22 receives supply of a current from the power supply line 32 and drives light emission of the organic EL element 21 based on current driving. Specifically, the drive transistor 22 operates in the saturation region to thereby supply, to the organic EL element 21, a drive current having the current value depending on the voltage value of the signal voltage $V_{sig}$ held in the hold capacitance 24 and make the organic EL element 21 emit light by current driving thereof.

When the supply potential DS is switched from the first supply potential $V_{ccp}$ to the second supply potential $V_{ini}$, one electrode of the drive transistor 22 serves as the source electrode and the other electrode serves as the drain electrode and the drive transistor 22 operates as a switching transistor. Furthermore, the drive transistor 22 becomes the non-conductive state to thereby stop the supply of the drive current to the organic EL element 21 and turn the organic EL element 21 to the non-light-emission state. That is, the drive transistor 22 has also a function as a transistor to control light-emission/non-light-emission of the organic EL element 21.

This switching operation of the drive transistor 22 can set the period during which the organic EL element 21 is in the non-light-emission state (non-light-emission period) and control the ratio between the light-emission period and the non-light-emission period of the organic EL element 21 (duty). By this duty control, residual image blur accompanying light emission of the pixel over one display frame period can be reduced and thus particularly the image quality of moving images can be made more excellent.

Of the first and second supply potentials $V_{ccp}$ and $V_{ini}$ selectively supplied from the power supply scan circuit 50 via the power supply line 32, the first supply potential $V_{ccp}$ is a supply potential for supplying the drive current for light emission driving of the organic EL element 21 to the drive transistor 22. The second supply potential $V_{ini}$ is a supply potential for applying a reverse bias to the organic EL element 21. This second supply potential $V_{ini}$ is set to a potential lower than the reference potential $V_{ofs}$, e.g. a potential lower than $V_{ofs}-V_{th}$ when the threshold voltage of the drive transistor 22 is $V_{th}$, preferably to a potential sufficiently lower than $V_{ofs}-V_{th}$.

1-2. Basic Circuit Operation

The basic circuit operation of the organic EL display device 10 having the above-described configuration will be described below based on a timing waveform diagram of FIG. 3 with use of operation explanatory diagrams of FIGS. 4A to 4H. In the operation explanatory diagrams of FIGS. 4A to 4H, the write transistor 23 is shown by a switch symbol for simplification of the drawings.

The timing waveform diagram of FIG. 3 shows change in each of the potential (write scan signal) WS of the scan line 31, the potential (supply potential) DS of the power supply line 32, the potential ($V_{sig}/V_{ofs}$) of the signal line 33, and the gate potential $V_g$ and the source potential $V_s$ of the drive transistor 22. The waveform of the gate potential $V_g$ of the drive transistor 22 is shown by a one-dot chain line and the waveform of the source potential $V_s$ is shown by a dotted line so that both potentials can be discriminated from each other.

(Light-Emission Period of Previous Display Frame)

In the timing waveform diagram of FIG. 3, the period before a time $t_{11}$ is the light-emission period of the organic EL element 21 in the previous display frame. In this light-emission period of the previous display frame, the potential DS of the power supply line 32 is the first supply potential (hereinafter, referred to as "higher potential") $V_{ccp}$ and the write transistor 23 is in the non-conductive state.

The drive transistor 22 is so designed as to operate in the saturation region at this time. Thus, as shown in FIG. 4A, the drive current (drain-source current) $I_{ds}$ depending on the gate-source voltage $V_{gs}$ of the drive transistor 22 is supplied from the power supply line 32 to the organic EL element 21 via the drive transistor 22. Thereby, the organic EL element 21 emits light with the luminance depending on the current value of the drive current $I_{ds}$.

(Threshold Correction Preparation Period)

Figure 4B:
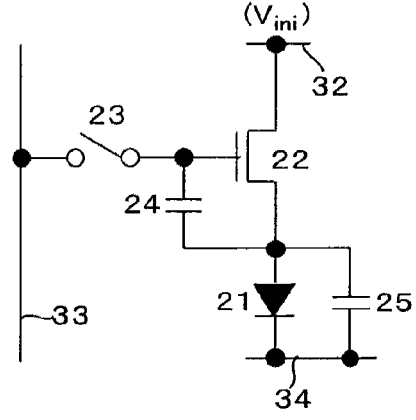

At the time $t_{11}$, a new display frame (present display frame) of the line-sequential scanning starts. At this time, as shown in FIG. 4B, the potential DS of the power supply line 32 is switched from the higher potential $V_{ccp}$ to the second supply potential (hereinafter, referred to as "lower potential") $V_{ini}$ sufficiently lower than $V_{ofs}-V_{th}$ with respect to the reference potential $V_{ofs}$ of the signal line 33.

Here, the threshold voltage of the organic EL element 21 is defined as $V_{thel}$ and the potential of the common power supply line 34 (cathode potential) is defined as $V_{cath}$. If the lower potential $V_{ini}$ is so set as to satisfy a relationship of $V_{ini}<V_{thel}+V_{cath}$, the organic EL element 21 becomes the reverse-biased state and stops its light emission because the source potential $V_s$ of the drive transistor 22 becomes almost equal to the lower potential $V_{ini}$.

Figure 4C:
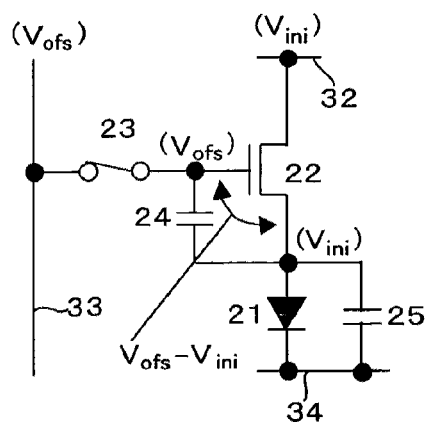

Next, the potential WS of the scan line 31 is shifted from the lower-potential side to the higher-potential side at a time $t_{12}$. Thereby, the write transistor 23 becomes the conductive state as shown in FIG. 4C. At this time, the reference potential $V_{ofs}$ is supplied from the signal output circuit 60 to the signal line 33 and therefore the gate potential $V_g$ of the drive transistor 22 becomes the reference potential $V_{ofs}$. The source potential $V_s$ of the drive transistor 22 is the potential $V_{ini}$ sufficiently lower than the reference potential $V_{ofs}$.

At this time, the gate-source voltage $V_{gs}$ of the drive transistor 22 is $V_{ofs}-V_{ini}$. Unless $V_{ofs}-V_{ini}$ is higher than the threshold voltage $V_{th}$ of the drive transistor 22, the threshold correction processing to be described later cannot be executed. Therefore, potential relationship of $V_{ofs}-V_{ini}>V_{th}$ should be set.

This processing of initializing the potentials by fixing the gate potential $V_g$ of the drive transistor 22 to the reference potential $V_{ofs}$ and fixing (settling) the source potential $V_s$ to the lower potential $V_{ini}$ in this manner is preparation (threshold correction preparation) processing before the threshold correction processing (threshold correction operation) to be described later. Therefore, the reference potential $V_{ofs}$ and the lower potential $V_{ini}$ serve as the initialization potential for the gate potential $V_g$ and the source potential $V_s$, respectively, of the drive transistor 22.

(Threshold Correction Period)

Figure 4D:
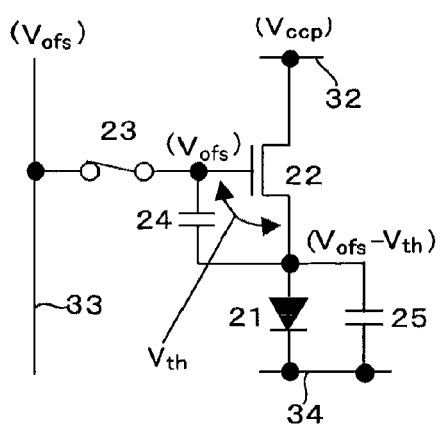

Next, at a time $t_{13}$, the potential DS of the power supply line 32 is switched from the lower potential $V_{ini}$ to the higher potential $V_{ccp}$ as shown in FIG. 4D. Thereupon, the threshold correction processing is started in the state in which the gate potential $V_g$ of the drive transistor 22 is kept at the reference potential $V_{ofs}$. Specifically, the source potential $V_s$ of the drive transistor 22 starts to rise toward the potential obtained by subtracting the threshold voltage $V_{th}$ of the drive transistor 22 from the gate potential $V_g$.

Here, for convenience, processing of employing the initialization potential $V_{ofs}$ for the gate potential $V_g$ of the drive transistor 22 as the basis and changing the source potential $V_s$ toward the potential obtained by subtracting the threshold voltage $V_{th}$ of the drive transistor 22 from this initialization potential $V_{ofs}$ is called the threshold correction processing. Along with the progression of this threshold correction processing, the gate-source voltage $V_{gs}$ of the drive transistor 22 converges on the threshold voltage $V_{th}$ of the drive transistor 22 in due course. The voltage equivalent to this threshold voltage $V_{th}$ is held in the hold capacitance 24.

In order that the current flows exclusively to the hold capacitance 24 and is prevented from flowing to the organic EL element 21 in the period of the threshold correction processing (threshold correction period), the potential $V_{cath}$ of the common power supply line 34 is so set that the organic EL element 21 is kept at the cut-off state in this period.

Figure 4E:
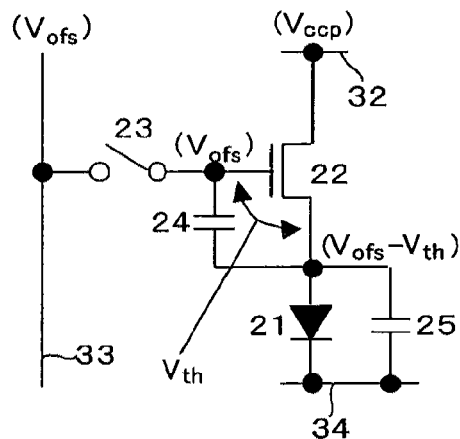

Next, the potential WS of the scan line 31 is shifted to the lower-potential side at a time $t_{14}$. Thereby, the write transistor 23 becomes the non-conductive state as shown in FIG. 4E. At this time, the gate electrode of the drive transistor 22 becomes the floating state by being electrically isolated from the signal line 33. However, because the gate-source voltage $V_{gs}$ is equal to the threshold voltage $V_{th}$ of the drive transistor 22, the drive transistor 22 is in the cut-off state. Therefore, the drain-source current $I_{ds}$ does not flow through the drive transistor 22.

(Signal Writing & Mobility Correction Period)

Figure 4F:
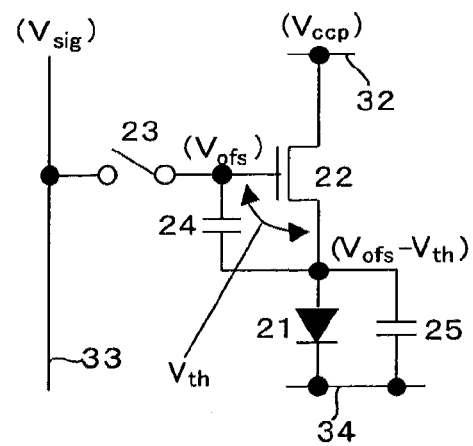
Figure 4G:
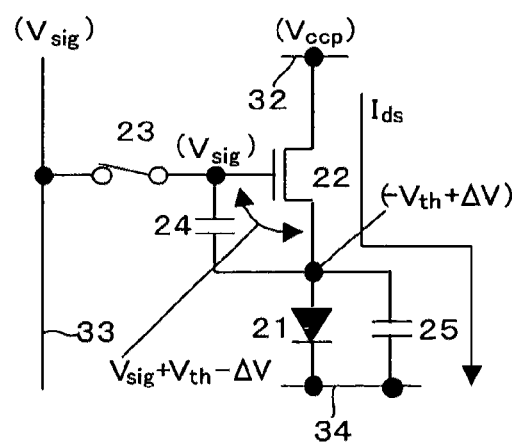

Next, at a time $t_{15}$, the potential of the signal line 33 is switched from the reference potential $V_{ofs}$ to the signal voltage $V_{sig}$ of the video signal as shown in FIG. 4F. Subsequently, at a time $t_{16}$, the potential WS of the scan line 31 is shifted to the higher-potential side. Thereby, as shown in FIG. 4G, the write transistor 23 becomes the conductive state to perform sampling of the signal voltage $V_{sig}$ of the video signal and write it in the pixel 20.

Due to this writing of the signal voltage $V_{sig}$ by the write transistor 23, the gate potential $V_g$ of the drive transistor 22 becomes the signal voltage $V_{sig}$. In driving of the drive transistor 22 based on the signal voltage $V_{sig}$ of the video signal, the threshold voltage $V_{th}$ of the drive transistor 22 is canceled out by the voltage equivalent to the threshold voltage $V_{th}$ held in the hold capacitance 24. Details of the principle of this threshold cancel will be described later.

At this time, the organic EL element 21 is in the cut-off state (high-impedance state). Therefore, the current (drain-source current Ids) flowing from the power supply line 32 to the drive transistor 22 depending on the signal voltage $V_{sig}$ of the video signal flows into the equivalent capacitance of the organic EL element 21 and the auxiliary capacitance 25, so that the charge of these capacitances is started.

Due to the charge of the equivalent capacitance of the organic EL element 21 and the auxiliary capacitance 25, the source potential $V_s$ of the drive transistor 22 rises over time. At this time, variation in the threshold voltage $V_{th}$ of the drive transistor 22 from pixel to pixel has been already canceled and the drain-source current $I_{ds}$ of the drive transistor 22 depends on the mobility μ of the drive transistor 22. The mobility μ of the drive transistor 22 is the mobility of the semiconductor thin film serving as the channel of the drive transistor 22.

Here, suppose that the ratio of the held voltage $V_{gs}$ of the hold capacitance 24 to the signal voltage $V_{sig}$ of the video signal, i.e. the writing gain, is 1 (ideal value). In this case, due to the rise of the source potential $V_s$ of the drive transistor 22 to a potential of $V_{ofs}-V_{th}+\Delta V$, the gate-source voltage $V_{gs}$ of the drive transistor 22 becomes $V_{sig}-V_{ofs}+V_{th}-\Delta V$.

Specifically, the rise component $\Delta V$ of the source potential $V_s$ of the drive transistor 22 acts in such a manner as to be subtracted from the voltage $(V_{sig}-V_{ofs}+V_{th})$ held in the hold capacitance 24, i.e. as to discharge the charge accumulated in the hold capacitance 24, and negative feedback is applied to the hold capacitance 24. Therefore, the rise component $\Delta V$ of the source potential $V_s$ is equivalent to the feedback amount of the negative feedback.

By applying negative feedback to the gate-source voltage $V_{gs}$ with the feedback amount $\Delta V$ depending on the drain-source current $I_{ds}$ flowing through the drive transistor 22 in this manner, the dependence of the drain-source current $I_{ds}$ of the drive transistor 22 on the mobility μ can be canceled. This cancel processing is the mobility correction processing to correct variation in the mobility μ of the drive transistor 22 from pixel to pixel.

Specifically, when the signal amplitude $V_{in}(=V_{sig}-V_{ofs})$ of the video signal written to the gate electrode of the drive transistor 22 is larger, the drain-source current $I_{ds}$ is larger and thus the absolute value of the feedback amount $\Delta V$ of the negative feedback is also larger. Therefore, the mobility correction processing depending on the light emission luminance level is executed.

If the signal amplitude $V_{in}$ of the video signal is set constant, when the mobility μ of the drive transistor 22 is higher, the absolute value of the feedback amount $\Delta V$ of the negative feedback is also larger. Thus, variation in the mobility μ from pixel to pixel can be eliminated. Therefore, the feedback amount $\Delta V$ of the negative feedback can be regarded also as the amount of correction of the mobility correction processing. Details of the principle of the mobility correction will be described later.

(Light-Emission Period)

Figure 4H:
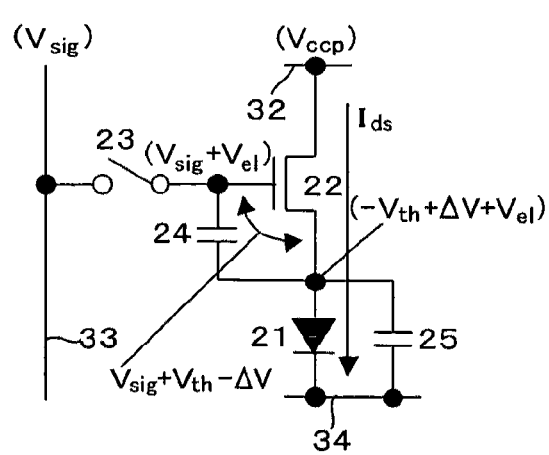

Next, the potential WS of the scan line 31 is shifted to the lower-potential side at a time $t_{17}$. Thereby, the write transistor 23 becomes the non-conductive state as shown in FIG. 4H. Thus, the gate electrode of the drive transistor 22 is electrically isolated from the signal line 33 and therefore becomes the floating state.

When the gate electrode of the drive transistor 22 is in the floating state, the gate potential $V_g$ also changes in linkage with change in the source potential $V_s$ of the drive transistor 22 because the hold capacitance 24 is connected between the gate and source of the drive transistor 22. The operation of this change in the gate potential $V_g$ of the drive transistor 22 in linkage with the change in the source potential $V_s$ is bootstrap operation by the hold capacitance 24.

The gate electrode of the drive transistor 22 becomes the floating state and simultaneously the drain-source current $I_{ds}$ of the drive transistor 22 starts to flow to the organic EL element 21. Thereby, the anode potential of the organic EL element 21 rises depending on this current $I_{ds}$.

When the anode potential of the organic EL element 21 surpasses $V_{thel}+V_{cath}$, the drive current starts to flow to the organic EL element 21 and thus the organic EL element 21 starts light emission. The rise of the anode potential of the organic EL element 21 is nothing more or less than the rise of the source potential $V_s$ of the drive transistor 22. When the source potential $V_s$ of the drive transistor 22 rises, the gate potential $V_g$ of the drive transistor 22 also rises in linkage with this source potential rise due to the bootstrap operation of the hold capacitance 24.

At this time, the amount of rise of the gate potential $V_g$ is equal to that of rise of the source potential $V_s$ if it is assumed that the bootstrap gain is 1 (ideal value). Therefore, during the light-emission period, the gate-source voltage $V_{gs}$ of the drive transistor 22 is kept constant at $V_{sig}-V_{ofs}+V_{th}-\Delta V$. At a time $t_{18}$, the potential of the signal line 33 is switched from the signal voltage $V_{sig}$ of the video signal to the reference potential $V_{ofs}$.

In the above-described series of circuit operation, the respective processing operations of the threshold correction preparation, the threshold correction, the writing of the signal voltage $V_{sig}$ (signal writing), and the mobility correction are carried out in one horizontal scanning period (1H). Furthermore, the respective processing operations of the signal writing and the mobility correction are carried out in parallel in the period from the time $t_{16}$ to the time $t_{17}$.

[Divided Threshold Correction]

The above description is made by taking as an example the case of employing the driving method in which the threshold correction processing is executed only once. However, this driving method is merely one example and the configuration is not limited to this driving method. For example, it is also possible to employ a driving method in which so-called divided threshold correction is performed, i.e. the threshold correction processing is executed plural times in a divided manner over plural horizontal scanning periods preceding the 1H period in which the threshold correction processing is executed together with the mobility correction and signal writing processing in addition to this 1H period.

If this driving method with the divided threshold correction is employed, a sufficient time can be ensured as the threshold correction period over plural horizontal scanning periods even if the time allocated as one horizontal scanning period becomes short due to increase in the number of pixels in association with enhancement in the resolution. Therefore, the threshold correction processing can be surely executed even if the time allocated as one horizontal scanning period becomes short.

[Principle of Threshold Cancel]

The principle of the threshold cancel (i.e. threshold correction) for the drive transistor 22 will be described below. The drive transistor 22 is so designed as to operate in the saturation region and thus operates as a constant current source. Due to this feature, the constant drain-source current (drive current) $I_{ds}$ given by the following equation (1) is supplied from the drive transistor 22 to the organic EL element 21.

$$I_{ds}=(1/2)\cdot\mu(W/L)C_{ox}(V_{gs}-V_{th})^2 \quad (1)$$

In this equation, W is the channel width of the drive transistor 22. L is the channel length. $C_{ox}$ is the gate capacitance per unit area.

Figure 5A:
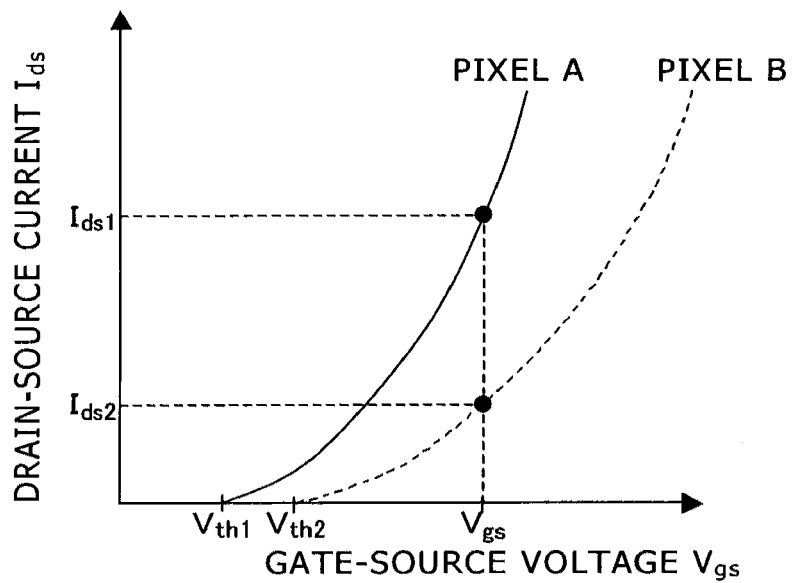
FIG. 5A is a characteristic diagram for explaining a problem attributed to variation in the threshold voltage $V_{th}$ of a drive transistor and FIG. 5B is a characteristic diagram for explaining a problem attributed to variation in the mobility μ of the drive transistor.

FIG. 5A shows the characteristic of drain-source current $I_{ds}$ vs. gate-source voltage $V_{gs}$ of the drive transistor 22. As shown in the characteristic diagram of FIG. 5A, unless the cancel processing (correction processing) for variation in the threshold voltage $V_{th}$ of the drive transistor 22 from pixel to pixel is executed, the drain-source current $I_{ds}$ corresponding to the gate-source voltage $V_{gs}$ is $I_{ds1}$ when the threshold voltage $V_{th}$ is $V_{th1}$.

On the other hand, when the threshold voltage $V_{th}$ is $V_{th2}$ ($V_{th2}>V_{th1}$) the drain-source current $I_{ds}$ corresponding to the same gate-source voltage $V_{gs}$ is $I_{ds2}$ ($I_{ds2}<I_{ds1}$). That is, if the threshold voltage $V_{th}$ of the drive transistor 22 varies, the drain-source current $I_{ds}$ varies even when the gate-source voltage $V_{gs}$ is constant.

In the pixel (pixel circuit) 20 having the above-described configuration, the gate-source voltage $V_{gs}$ of the drive transistor 22 in light emission is $V_{sig}-V_{ofs}+V_{th}-\Delta V$ as described above. Therefore, if this voltage $V_{gs}$ is substituted in equation (1), the drain-source current $I_{ds}$ is represented by the following equation (2).

$$I_{ds}=(1/2)\cdot\mu(W/L)C_{ox}(V_{sig}-V_{ofs}-\Delta V)^2 \quad (2)$$

That is, the term of the threshold voltage $V_{th}$ of the drive transistor 22 is canceled, so that the drain-source current $I_{ds}$ supplied from the drive transistor 22 to the organic EL element 21 does not depend on the threshold voltage $V_{th}$ of the drive transistor 22. As a result, even when the threshold voltage $V_{th}$ of the drive transistor 22 varies from pixel to pixel due to variation in the manufacturing process of the drive transistor 22, change over time, and so forth, the drain-source current $I_{ds}$ does not vary and thus the light emission luminance of the organic EL element 21 can be kept constant.

[Principle of Mobility Correction]

Figure 5B:
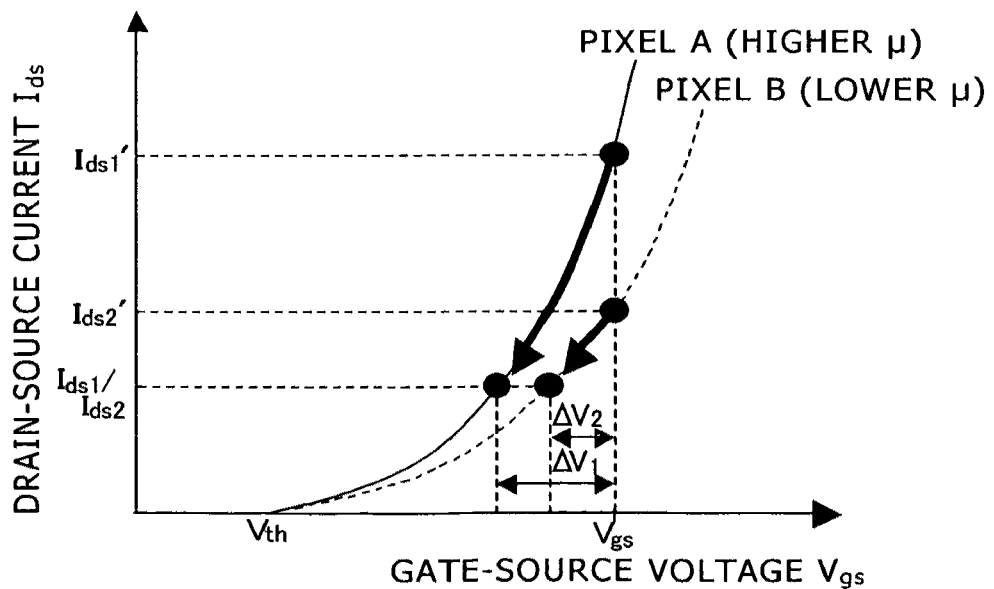

The principle of the mobility correction for the drive transistor 22 will be described below. FIG. 5B shows characteristic curves with comparison between pixel A in which the mobility μ of the drive transistor 22 is relatively higher and pixel B in which the mobility μ of the drive transistor 22 is relatively lower. If the drive transistor 22 is configured by a poly-silicon thin film transistor or the like, inevitably the mobility μ varies among the pixels like pixel A and pixel B.

A consideration will be made below about the case in which the mobility μ varies between pixels A and B and e.g. the signal amplitude $V_{in}(=V_{sig}-V_{ofs})$ at the same level is written to the gate electrode of the drive transistor 22 of both pixels A and B. In this case, if correction of the mobility μ is not performed at all, large difference arises between a drain-source current $I_{ds1}'$ flowing in pixel A having the higher mobility μ and a drain-source current $I_{ds2}'$ flowing in pixel B having the lower mobility μ. If large difference in the drain-source current $I_{ds}$ arises among the pixels attributed to variation in the mobility μ among the pixels in this manner, the uniformity (evenness) of the screen is spoiled.

As is apparent from the transistor characteristic expression of the above-described equation (1), the higher mobility μ yields the larger drain-source current $I_{ds}$. Therefore, the higher the mobility μ is, the larger the feedback amount ΔV of negative feedback is. As shown in FIG. 5B, the amount $ΔV_1$ of feedback in pixel A having the higher mobility μ is larger than the amount $ΔV_2$ of feedback in pixel B having the lower mobility μ.

So, if negative feedback is applied to the gate-source voltage $V_{gs}$ with the feedback amount ΔV depending on the drain-source current $I_{ds}$ of the drive transistor 22 by the mobility correction processing, the extent of this negative feedback is larger when the mobility μ is higher. As a result, the variation in the mobility μ from pixel to pixel can be suppressed.

Specifically, when correction with the amount $ΔV_1$ of feedback is performed in pixel A having the higher mobility μ, the drain-source current $I_{ds}$ greatly drops from $I_{ds1}'$ to $I_{ds1}$. In contrast, the amount $ΔV_2$ of feedback in pixel B having the lower mobility μ is small. Therefore, the drain-source current $I_{ds}$ does not drop so greatly, i.e. the drop is from $I_{ds2}'$ to $I_{ds2}$. As a result, the drain-source current $I_{ds1}$ of pixel A is almost equal to the drain-source current $I_{ds2}$ of pixel B, so that the variation in the mobility μ from pixel to pixel is corrected.

In conclusion, when there are pixel A and pixel B having the different mobility μ, the amount $ΔV_1$ of feedback in pixel A having the higher mobility μ is larger than the amount $ΔV_2$ of feedback in pixel B having the lower mobility μ. That is, the amount ΔV of feedback is larger and the amount of decrease in the drain-source current $I_{ds}$ is larger in the pixel having the higher mobility μ.

Therefore, by applying negative feedback to the gate-source voltage $V_{gs}$ with the feedback amount ΔV depending on the drain-source current $I_{ds}$ of the drive transistor 22, the current value of the drain-source current $I_{ds}$ of the pixels having the different mobility μ is made uniform. As a result, variation in the mobility μ from pixel to pixel can be corrected. That is, the mobility correction processing is the processing of applying negative feedback to the gate-source voltage $V_{gs}$ of the drive transistor 22, i.e. the hold capacitance 24, with the feedback amount (correction amount) ΔV depending on the current (drain-source current $I_{ds}$) flowing through the drive transistor 22.

1-3. Configuration Examples of Drive Circuit Parts

Configuration examples of the circuit parts disposed around the pixel array part 30, i.e. the drive circuit parts to drive the respective pixels 20 of the pixel array part 30, will be described below.

(A. Write Scan Circuit)

First, a description will be made by taking, as an example of the drive circuit part, the write scan circuit 40 to sequentially select and scan the respective pixels 20 on a row-by-row basis in writing of the signal voltage $V_{sig}$/reference potential $V_{ofs}$ to the respective pixels 20 of the pixel array part 30.

Figure 6A:
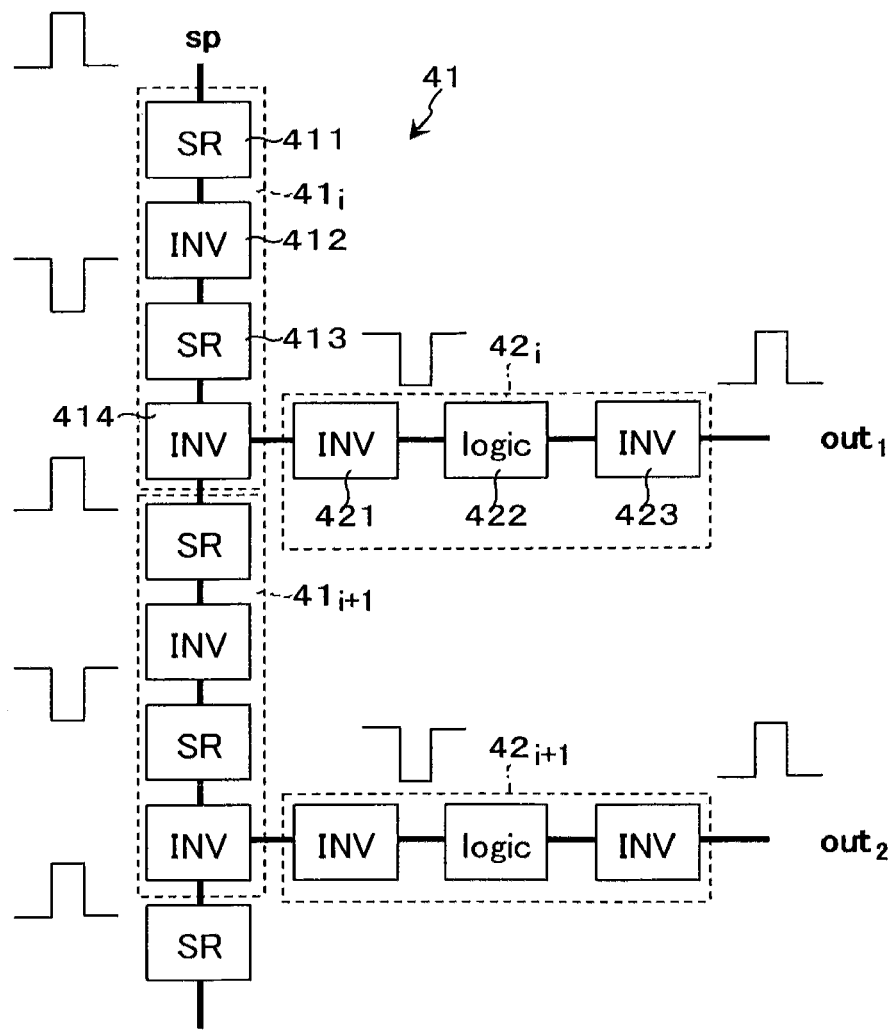
FIGS. 6A and 6B are explanatory diagrams about a write scan circuit.
Figure 6B:
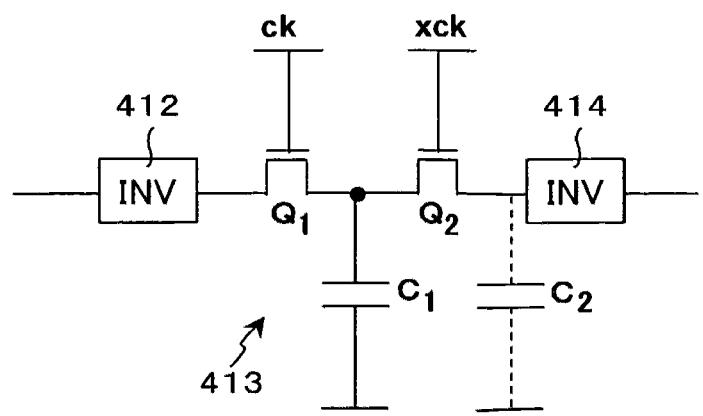

FIGS. 6A and 6B are explanatory diagrams about a configuration example of the write scan circuit 40. FIG. 6A shows one example of the configuration of the write scan circuit 40 and FIG. 6B shows a circuit example of a shift register configuring the write scan circuit 40.

Referring to FIG. 6A, basically the write scan circuit 40 includes a shift register circuit 41 that sequentially shifts (transfers) the start pulse sp in synchronization with the clock pulse ck (not shown) as its major part. Furthermore, the write scan circuit 40 includes buffer circuits ..., $42_i$, $42_{i+1}$, ... at transfer stages (unit circuits) ..., $41_i$, $41_{i+i}$, ..., respectively, of the shift register circuit 41 corresponding to the respective rows of the pixel array part 30.

Although the configuration in which the transfer stages $41_i$ and $41_{i+1}$ for two stages of the i-th row and the i+1-th row are cascaded is shown as the shift register circuit 41 in this diagram, actually the transfer stages $41_1$ to $41_m$ for the number of rows of the pixel array part 30 are cascaded. Each of the transfer stages of the shift register circuit 41, e.g. the transfer stage $41_i$ of the i-th row, configures the unit circuit through cascading of a shift register (SR) 411, an inverter (INV) 412, a shift register 413, and an inverter 414.

A specific circuit example of the inverters 412 and 414 will be described later. As shown in FIG. 6B, the shift register 413 is composed of a transistor $Q_1$ that operates by the clock pulse ck, a transistor $Q_2$ that operates by a clock pulse xck, and capacitance $C_1$. Parasitic capacitance $C_2$ intervenes between the output terminal of the shift register 413 and the input terminal of the inverter 414.

Referring back to FIG. 6A, the buffer circuit $42_i$ is configured by cascading an inverter 421, a logic circuit 422, and an inverter 423. In this manner, the respective transfer stages $41_i$ and $41_{i+1}$ of the shift register circuit 41 and the buffer circuits 42 ($42_i$, $42_{i+1}$) are configured by using the inverter circuit.

(B. Inverter Circuit with Single-Channel Transistors)

In fabrication of the drive circuit part such as the write scan circuit 40, if the drive circuit part is configured by using transistors based on a single channel (only N-channel or only P-channel), the manufacturing cost can be reduced compared with the case of using transistors based on both channels. Therefore, to achieve cost reduction of the organic EL display device 10, it is preferable that, in e.g. the write scan circuit 40, the inverter circuit included in the shift register circuit 41 and the buffer circuit 42 be configured by using single-channel transistors.

In the case of configuring the inverter circuit by using single-channel transistors, a circuit configuration based on the combination of the single-channel transistors and capacitive elements is employed in order to ensure the circuit operation of the inverter circuit. A description will be made below about an inverter circuit that is used as e.g. the inverters 412 and 414 included in the shift register circuit 41 and is formed of the combination of single-channel transistors and capacitive elements.

<<Circuit Configuration>>

Figure 7A:
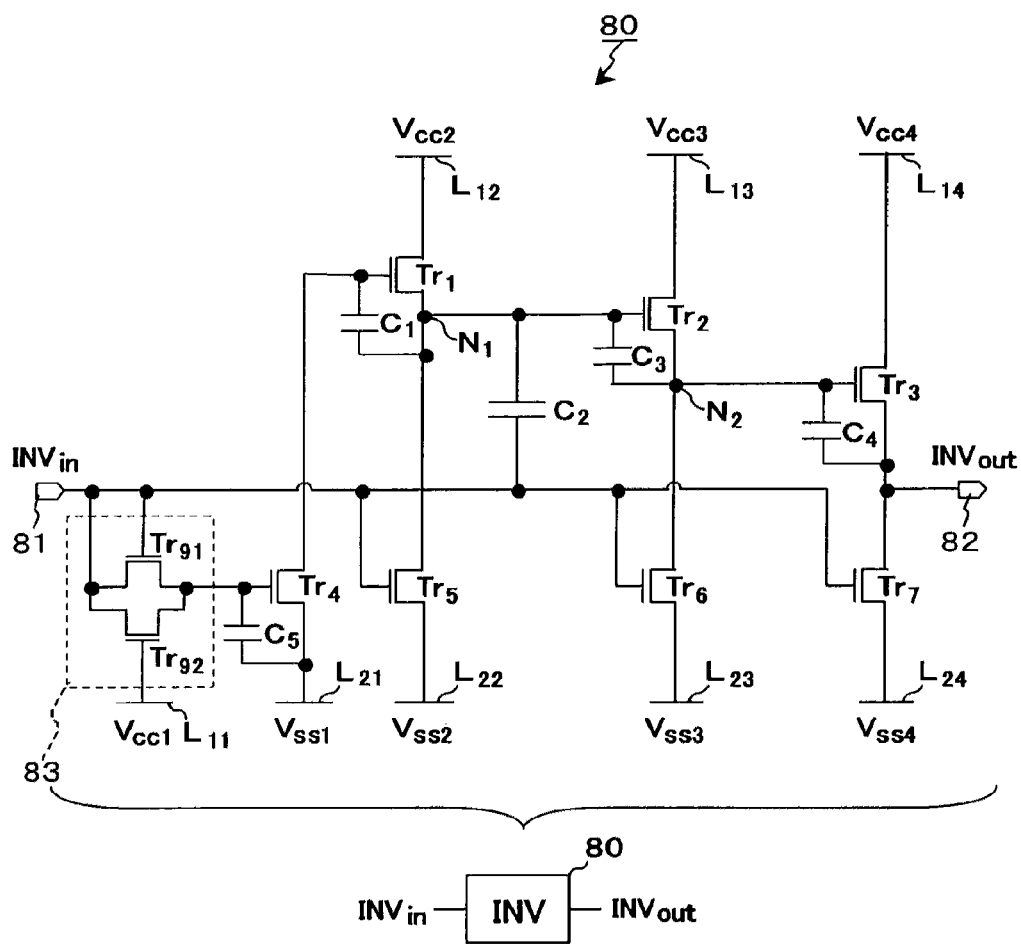
FIGS. 7A and 7B are explanatory diagrams about an inverter circuit formed of the combination of single-channel transistors and capacitive elements.
Figure 7B:
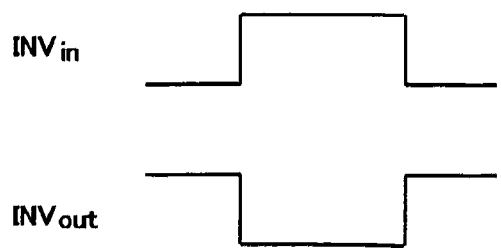

FIGS. 7A and 7B are explanatory diagrams about the inverter circuit formed of the combination of single-channel transistors and capacitive elements. FIG. 7A shows one example of the circuit configuration and FIG. 7B shows the respective waveforms of an input pulse signal $INV_{in}$ and an output pulse signal $INV_{out}$.

An inverter circuit 80 according to the present circuit example substantially inverts the pulse signal $INV_{in}$ input via an input terminal 81 and outputs the inverted signal from an output terminal 82 as the pulse signal $INV_{out}$ in antiphase with the pulse signal $INV_{in}$. In this inverter circuit 80, as supply voltages, e.g. four supply voltages $V_{cc1}$, $V_{cc2}$, $V_{cc3}$, and $V_{cc4}$ are used as the positive-side voltages and e.g. four supply voltages $V_{ss1}$, $V_{ss2}$, $V_{ss3}$, and $V_{ss4}$ are used as the negative-side voltages. However, the supply voltages exemplified here are one example and the supply voltages are not limited thereto. A smaller number of supply voltages may be employed and it is also possible to employ only one kind of supply voltage on each of the positive side and the negative side.

The inverter circuit 80 has e.g. a circuit configuration including seven transistors $Tr_1$ to $Tr_7$, five capacitive elements $C_1$ to $C_5$, and a delay circuit 83. Seven transistors $Tr_1$ to $Tr_7$ are metal oxide semiconductor (MOS) thin film transistors (TFTs) having the channel of the same conductivity type (single channel), e.g. the N-channel. Although transistors having only the N-channel are used as the transistors $Tr_1$ to $Tr_7$ in this example, it is also possible to use transistors having only the P-channel.

The drain electrode of the transistor $Tr_1$ is connected to a power supply line $L_{12}$ of the positive-side supply voltage $V_{cc2}$ and its source electrode is connected to a node $N_1$. Its gate input is a voltage depending on the input voltage (pulse signal $INV_{in}$) input via the input terminal 81. The drain electrode of the transistor $Tr_2$ is connected to a power supply line $L_{13}$ of the positive-side supply voltage $V_{cc3}$ and its source electrode is connected to a node $N_2$. Its gate electrode is connected to the node $N_1$. The drain electrode of the transistor $Tr_3$ is connected to a power supply line $L_{14}$ of the positive-side supply voltage $V_{cc4}$ and its source electrode is connected to the output terminal 82. Its gate electrode is connected to the node $N_2$.

The delay circuit 83 is composed of two transistors $Tr_{91}$ and $Tr_{92}$ connected in parallel to each other for example. Two transistors $Tr_{91}$ and $Tr_{92}$ are N-channel MOS transistors as with the transistors $Tr_1$ to $Tr_7$, of course. One electrode (source electrode/drain electrode) of each of the transistors $Tr_{91}$ and $Tr_{92}$, connected in common, serves as the circuit input terminal of the delay circuit 83 and the other electrode (drain electrode/source electrode) serves as the circuit output terminal of the delay circuit 83.

In this delay circuit 83, the circuit input terminal is connected to the input terminal 81. The gate electrode of the transistor $Tr_{91}$ is also connected to the input terminal 81. The gate electrode of the transistor $Tr_{92}$ is connected to a power supply line $L_{11}$ of the positive-side supply voltage $V_{cc1}$.

The drain electrode of the transistor $Tr_4$ is connected to the gate electrode of the transistor $Tr_1$ and its source electrode is connected to a power supply line $L_{21}$ of the negative-side supply voltage $V_{ss1}$. Its gate electrode is connected to the circuit output terminal of the delay circuit 83. The drain electrode of the transistor $Tr_5$ is connected to the node $N_1$ and its source electrode is connected to a power supply line $L_{22}$ of the negative-side supply voltage $V_{ss2}$. That is, the transistor $Tr_5$ is connected in series to the transistor $Tr_1$, and its gate electrode is connected to the input terminal 81.

The drain electrode of the transistor $Tr_6$ is connected to the node $N_2$ and its source electrode is connected to a power supply line $L_{23}$ of the negative-side supply voltage $V_{ss3}$. That is, the transistor $Tr_6$ is connected in series to the transistor $Tr_2$, and its gate electrode is connected to the input terminal 81. The drain electrode of the transistor $Tr_7$ is connected to the output terminal 82 and its source electrode is connected to a power supply line $L_{24}$ of the negative-side supply voltage $V_{ss4}$. Its gate electrode is connected to the input terminal 81.

One electrode of the capacitive element $C_1$ is connected to the gate electrode of the transistor $Tr_1$ and the other electrode is connected to the node $N_1$. That is, the capacitive element $C_1$ is connected between the gate and source of the transistor $Tr_1$. One electrode of the capacitive element $C_2$ is connected to the node $N_1$ and the other electrode is connected to the input terminal 81. The node $N_1$ serves also as the common connection node of the transistor $Tr_1$ and the transistor $Tr_5$.

One electrode of the capacitive element $C_3$ is connected to the gate electrode of the transistor $Tr_2$ and the other electrode is connected to the node $N_2$. One electrode of the capacitive element $C_4$ is connected to the gate electrode of the transistor $Tr_1$ and the other electrode is connected to the output terminal 82. One electrode of the capacitive element $C_5$ is connected to the gate electrode of the transistor $Tr_4$ and the other electrode is connected to the power supply line $L_{21}$ of the negative-side supply voltage $V_{ss1}$.

The delay circuit 83 composed of the transistors $Tr_{91}$ and $Tr_{92}$ has a role of a high-resistance element to couple the input terminal 81 to the gate electrode of the transistor $Tr_4$. Thus, due to the passage of the pulse signal $INV_{in}$ input via the input terminal 81 through the delay circuit 83, change in the potential of the pulse signal $INV_{in}$ is transmitted to the gate electrode of the transistor $Tr_4$ with time delay. The amount of delay by the delay circuit 83 can be controlled by changing the voltage value of the positive-side supply voltage $V_{cc1}$ and the capacitance value of the capacitive element $C_5$.

The transistor $Tr_1$ electrically connects and disconnects the power supply line $L_{12}$ of the positive-side supply voltage $V_{cc2}$ to and from the node $N_1$ depending on the voltage across the capacitive element $C_1$. The transistor $Tr_2$ electrically connects and disconnects the power supply line $L_{13}$ of the positive-side supply voltage $V_{cc3}$ to and from the node $N_2$ depending on the potential difference between the potential of the node $N_1$ and the potential of the node $N_2$, i.e. the voltage across the capacitive element $C_3$. The transistor $Tr_1$ electrically connects and disconnects the power supply line $L_{14}$ of the positive-side supply voltage $V_{cc4}$ to and from the output terminal 82 depending on the potential difference between the potential of the node $N_2$ and the potential of the output terminal 82, i.e. the voltage across the capacitive element $C_4$.

The transistor $Tr_4$ electrically connects and disconnects the gate electrode of the transistor $Tr_1$ to and from the power supply line $L_{21}$ of the negative-side supply voltage $V_{ss1}$ depending on the potential difference between the potential of the output terminal of the delay circuit 83 and the negative-side supply voltage $V_{ss1}$, i.e. the voltage across the capacitive element $C_s$. The transistor $Tr_5$ electrically connects and disconnects the node $N_1$ to and from the power supply line $L_{22}$ of the negative-side supply voltage $V_{ss2}$ depending on the potential difference between the potential of the input terminal 81 and the negative-side supply voltage $V_{ss2}$. The transistor $Tr_6$ electrically connects and disconnects the node $N_2$ to and from the power supply line $L_{23}$ of the negative-side supply voltage $V_{ss3}$ depending on the potential difference between the potential of the input terminal 81 and the negative-side supply voltage $V_{ss3}$. The transistor $Tr_1$ electrically connects and disconnects the output terminal 82 to and from the power supply line $L_{24}$ of the negative-side supply voltage $V_{ss4}$ depending on the potential difference between the potential of the input terminal 81 and the negative-side supply voltage $V_{ss4}$.

<<Circuit Operation>>

A description will be made below about circuit operation in the inverter circuit 80 having the above-described configuration when the pulse signal $INV_{in}$ input via the input terminal 81 becomes the active state (higher-potential state) and when it becomes the inactive state (lower-potential state).

Operation When Pulse Signal $INV_{in}$ Becomes Active State

When the pulse signal $INV_{in}$ becomes the active state, the gate potential of the transistor $Tr_7$ becomes the higher-potential state and the transistor $Tr_7$ becomes the conductive state. Thus, the negative-side supply voltage $V_{ss4}$ is derived from the output terminal 82 as the lower potential of the pulse signal $INV_{out}$. Simultaneously, the transistors $Tr_5$ and $Tr_6$ also become the conductive state and therefore the potentials of the nodes $N_1$ and $N_2$ are fixed to the negative-side supply potentials $V_{ss2}$ and $V_{ss3}$, respectively.

Thereby, both the transistors $Tr_2$ and $Tr_3$ become the non-conductive state. Furthermore, the transistor $Tr_4$ becomes the conductive state in response to the delayed output of the delay circuit 83 and therefore the gate potential of the transistor $Tr_1$ is fixed to the negative-side supply voltage $V_{ss1}$. Thereby, the transistor $Tr_1$ also becomes the non-conductive state. That is, when the pulse signal $INV_{in}$ becomes the active state, all of the positive-side transistors $Tr_1$, $Tr_2$, and $Tr_3$ become the non-conductive state.

Operation When Pulse Signal $INV_{in}$ Becomes Inactive State

When the pulse signal $INV_{in}$ becomes the inactive state, simultaneously all of the transistors $Tr_5$, $Tr_6$, and $Tr_7$ on the negative potential side become the non-conductive state. In addition, the potential of the node $N_1$, i.e. the gate potential of the transistor $Tr_2$, drops due to capacitive coupling of the capacitive element $C_2$ depending on the amount of change in the transition of the pulse signal $INV_{in}$ from the higher potential to the lower potential.

At the moment of this potential drop due to the capacitive coupling, the gate potential of the transistor $Tr_4$ keeps the higher-potential state due to the delay by the delay circuit 83 and therefore the gate potential of the transistor $Tr_1$ is the negative-side supply voltage $V_{ss1}$. Therefore, the gate-source voltage $V_{gs}$ of the transistor $Tr_1$ becomes higher along with the potential drop of the node $N_1$ and surpasses the threshold voltage, so that the transistor $Tr_1$ becomes the conductive state. Thereby, the potential of the node $N_1$ rises toward the positive-side supply voltage $V_{cc2}$.

Thereupon, the gate-source voltage $V_{gs}$ of the transistor $Tr_2$ also becomes higher and thus the transistor $Tr_2$ also becomes the conductive state. Thereby, the potential of the node $N_2$ rises toward the positive-side supply voltage $V_{cc3}$ and the gate-source voltage $V_{gs}$ of the transistor $Tr_3$ also becomes higher. Thus, the transistor $Tr_3$ also becomes the conductive state subsequently to the transistor $Tr_2$. Because the transistor $Tr_3$ becomes the conductive state, the positive-side supply voltage $V_{cc4}$ is derived from the output terminal 82 as the positive potential of the pulse signal $INV_{out}$.

It is preferable that the capacitance value of the capacitive element $C_2$ be set somewhat large in order to shift the transistor $Tr_1$ to the conductive state more rapidly by the drop of the gate potential of the transistor $Tr_2$ due to the capacitive coupling of the capacitive element $C_2$. Due to the rapid shift of the transistor $Tr_1$ to the conductive state, the transition timing (rising-up/falling-down timing) of the pulse signal $INV_{out}$ can be settled more accurately.

The transition timing of the pulse signal $INV_{out}$ determines the pulse width of the pulse signal $INV_{out}$. If the drive circuit part is the write scan circuit 40, the pulse signal $INV_{out}$ is used as the signal serving as the basis of generation of the write scan signal WS. Therefore, the pulse width of the pulse signal $INV_{out}$ serves as the basis that determines the pulse width of the write scan signal WS, and serves as the basis that determines the operation time of the above-described mobility correction processing, i.e. the mobility correction time.

Even when the pulse width of the write scan signal WS involves the same amount (time) of variation between when the optimum mobility correction time is long and when it is short, the variation in the pulse width of the write scan signal WS when the optimum mobility correction time is short is relatively large. The variation in the pulse width of the write scan signal WS leads to variation in the luminance and contributes to the deterioration of the image quality. Also from this viewpoint, it is important to set the capacitance value of the capacitive element $C_2$ large and shift the transistor $Tr_1$ to the conductive state more rapidly to thereby settle the transition timing of the pulse signal $INV_{out}$ serving as the basis to determine the mobility correction time more accurately.

As is apparent from the above description of the circuit operation, in the inverter circuit 80 configured with single-channel transistors, particularly the capacitive element $C_2$, which drops the potential of the node $N_1$ by capacitive coupling, is important to ensure the circuit operation. Besides the capacitive element $C_2$, the capacitive element $C_1$, the capacitive element $C_3$, and the capacitive element $C_4$ to hold the gate-source voltage $V_{gs}$ of the transistors $Tr_1$, $Tr_2$, and $Tr_1$ are also important. These capacitive elements $C_1$ to $C_4$ are unnecessary in the inverter circuit configured with transistors based on both channels.

The above-described inverter circuit 80 formed of the combination of single-channel transistors and capacitive elements can be used as e.g. the inverters 421 and 423 included in the buffer circuit 42 of the write scan circuit 40 shown in FIG. 6A in addition to the inverters 412 and 414 included in the shift register circuit 41. The power supply scan circuit 50 also has a configuration similar to that of the write scan circuit 40 basically and therefore the inverter circuit 80 can be used also as the inverter included in the power supply scan circuit 50.

(C. Signal Output Circuit)

The following description will be made by taking as an example the signal output circuit 60, which selectively outputs the signal voltage $V_{sig}$/reference potential $V_{ofs}$ depending on luminance information, to the respective pixels 20 on the pixel row selectively scanned by the write scan circuit 40.

Figure 8:
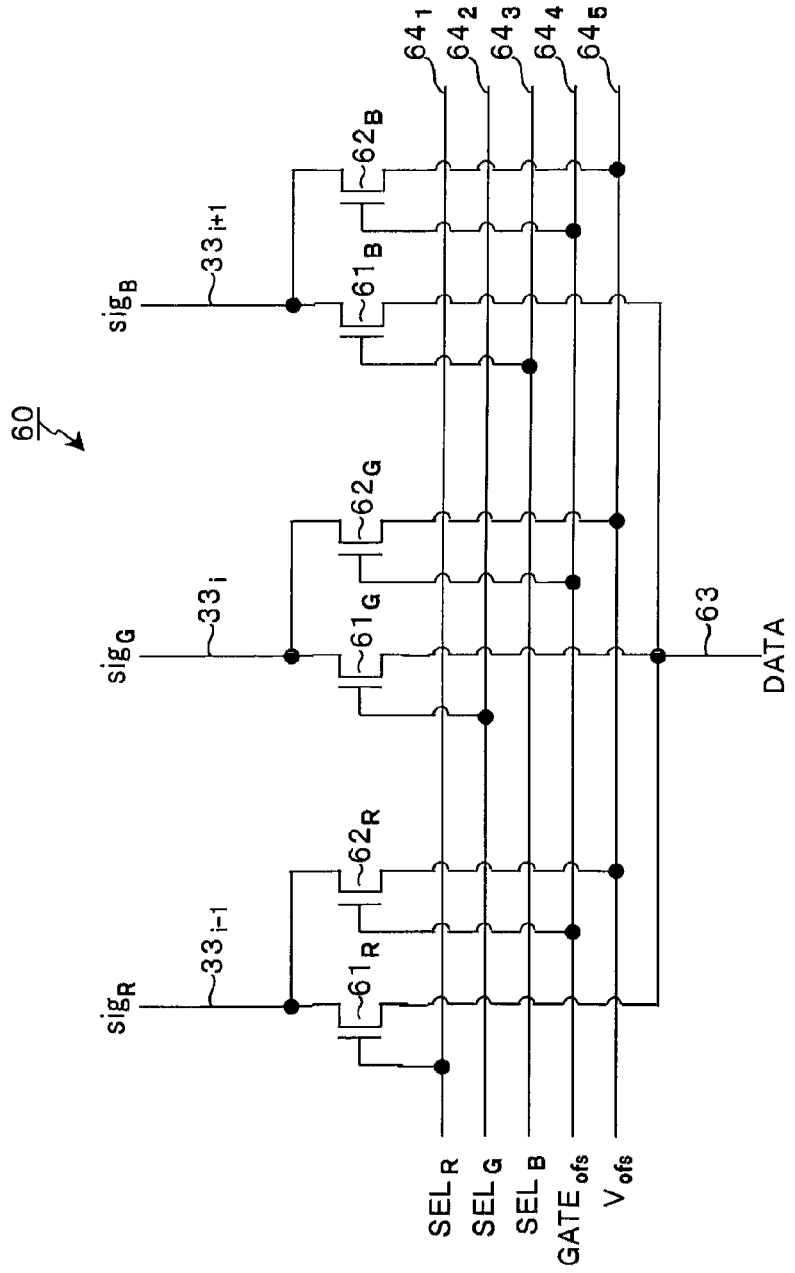
FIG. 8 is a circuit diagram showing one example of the configuration of a signal output circuit.

FIG. 8 is a circuit diagram showing one example of the configuration of the signal output circuit 60. The signal output circuit 60 according to the present example employs a time-division driving system (selector system) in which e.g. a video signal DATA of RGB supplied in a time-series manner via one data line is supplied in a time-division manner in units of three signal lines corresponding to RGB.

Referring to FIG. 8, the respective output terminals of two selection switches $61_R$ and $62_R$ are connected to one end of a signal line $33_{i-1}$ of R in common. The respective output terminals of two selection switches $61_G$ and $62_G$ are connected to one end of a signal line $33_i$ of G in common. The respective output terminals of two selection switches $61_B$ and $62_B$ are connected to one end of a signal line $33_{i+1}$ of B in common.

The selection switches $61_R$, $61_G$, and $61_B$ and the selection switches $62_R$, $62_G$, and $62_B$ are formed of e.g. Nch MOS transistors. However, it is also possible to employ a configuration in which the selection switches $61_R$, $61_G$, and $61_B$ and the selection switches $62_R$, $62_G$, and $62_B$ are formed of Pch MOS transistors or a configuration in which an Nch MOS transistor and a Pch MOS transistor are connected in parallel.

The video signal DATA is a time-series signal by which the respective signal voltages of RGB are supplied e.g. in order of RGB and is given from a driver IC (signal generator, not shown) via a data line 63 to the respective input terminals of the selection switches $61_R$, $61_G$, and $61_B$ in common. The reference potential $V_{ofs}$ is given from a reference potential generator (not shown) via a signal line $64_5$ to the respective input terminals of the selection switches $62_R$, $62_G$, and $62_B$ in common.

The respective gates of the selection switches $61_R$, $61_G$, and $61_B$ are connected to control lines $64_1$, $64_2$, and $64_3$, respectively. The respective gates of the selection switches $62_R$, $62_G$, and $62_B$ are connected to the control line $64_4$ in common. Switch control signals $SEL_R$, $SEL_G$, $SEL_B$, and $GATE_{ofs}$ are given from a timing generator (not shown) to the control lines $64_1$, $64_2$, $64_3$, and $64_4$, respectively.

The switch control signal $SEL_R$ becomes the active state (in the present example, high level) in synchronization with the signal voltage of R of the time-series signal. The switch control signal $SEL_G$ becomes the active state in synchronization with the signal voltage of G of the time-series signal. The switch control signal $SEL_B$ becomes the active state in synchronization with the signal voltage of B of the time-series signal. The switch control signal $GATE_{ofs}$ becomes the active state at the writing timing of the above-described reference potential $V_{ofs}$.

In the above-described configuration, the selection switch $61_R$ becomes the conductive state in response to the switch control signal $SEL_R$ to thereby select the signal voltage of R and output it to the signal line $33_{i-1}$. The selection switch $61_G$ becomes the conductive state in response to the switch control signal $SEL_G$ to thereby select the signal voltage of G and output it to the signal line $33_i$. The selection switch $61_B$ becomes the conductive state in response to the switch control signal $SEL_B$ to thereby select the signal voltage of B and output it to the signal line $33_{i+1}$. The selection switches $62_R$, $62_G$, and $62_B$ become the conductive state in response to the switch control signal $GATE_{ofs}$ to thereby select the reference potential $V_{ofs}$ and output it to the signal lines $33_{i-1}$, $33_i$, and $33_{i+1}$.

(D. Thin Film Transistor Including Oxide Semiconductor as Channel Material)

In the configuration examples of the above-described drive circuit parts, i.e. the write scan circuit 40 and the signal output circuit 60, a thin film transistor including an oxide semiconductor as its channel material (hereinafter, referred to as "oxide semiconductor TFT") can be used as the transistor to configure the circuit parts.

Representative examples of the oxide semiconductor include IGZO (In—Ga—Zn—O; indium gallium zinc oxide), ZnO (zinc oxide), NiO (nickel oxide), $SnO_2$ (tin oxide), $TiO_2$ (titanium oxide), $VO_2$ (vanadium oxide), and $In_2O_3$ (indium oxide).

Also as described above, the oxide semiconductor TFT has higher carrier mobility and exhibits more excellent semiconductor characteristics compared with a thin film transistor including amorphous silicon as its channel material (amorphous-silicon TFT). Therefore, the circuit part using the oxide semiconductor TFT can be mounted on the same substrate as that of the pixel array part 30, i.e. on the display panel 70.

(E. Trouble at Place where Interconnects Intersect Each Other)

Figure 9A:
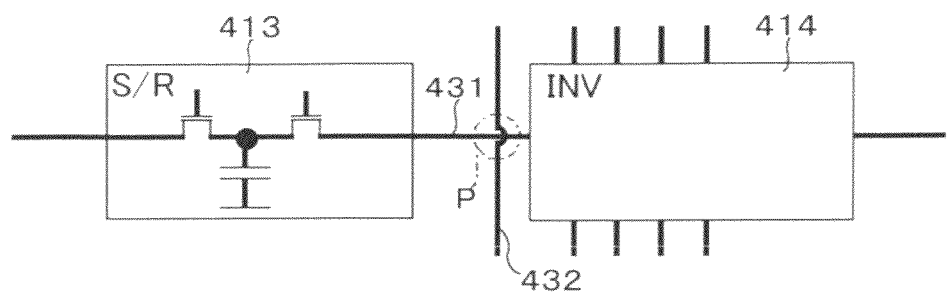
FIGS. 9A to 9C are explanatory diagrams about a trouble at an interconnect intersection part according to a related-art example.

In the organic EL display device 10, inevitably a place where interconnects intersect each other occurs in the circuit part around the pixel array part 30 and therefore naturally a place where the upper interconnect crosses over the lower interconnect exists. Here, the case of the shift register circuit 41 (see FIGS. 6A and 6B) included in the above-described write scan circuit 40 is taken as one example. As shown in FIG. 9A, when a signal line 431 between the shift register 413 and the inverter 414 is regarded as the lower interconnect, e.g. a power supply line 432 as the upper interconnect crosses over this signal line 431.

Figure 9B:
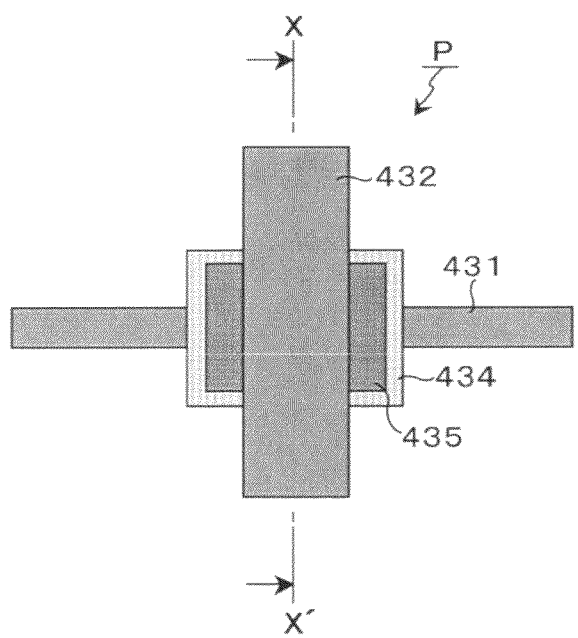
Figure 9C:
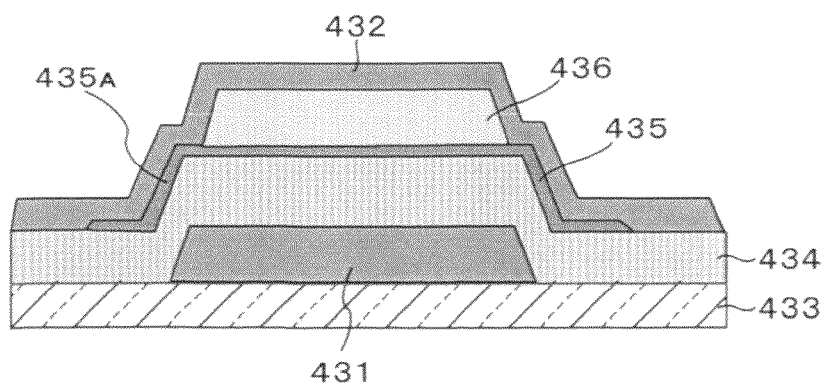

In general, at this place where the interconnects intersect each other, i.e. at the interconnect intersection part P, the film thickness of the interlayer insulating film is set large in order to prevent interlayer short circuit between the signal line 431 as the lower interconnect and the power supply line 432 as the upper interconnect. This will be specifically described below with use of FIGS. 9B and 9C. FIG. 9B shows an enlarged planar pattern of the interconnect intersection part P in the related-art structure. FIG. 9C shows a section along line X-X' in FIG. 9B.

In FIGS. 9B and 9C, the signal line 431 as the lower interconnect is formed on a substrate 433 by a metal interconnect of e.g. molybdenum (Mo) in the same process as that of the gate electrode of the oxide semiconductor TFT included in the circuit part. A gate insulating film 434 is formed on this signal line 431 in the same process as that of the oxide semiconductor TFT. An oxide semiconductor layer 435 is formed as the channel layer on the gate insulating film 434 and a channel protective film 436 is formed on the oxide semiconductor layer 435. The power supply line 432 is formed as the upper interconnect on the channel protective film 436 by a metal interconnect of e.g. aluminum (Al).

In this manner, the gate insulating film 434, the oxide semiconductor layer 435, and the channel protective film 436 are stacked between the lower interconnect (signal line) 431 and the upper interconnect (power supply line) 432. Thereby, the film thickness of the interlayer insulating film is set large to prevent interlayer short circuit between the lower interconnect 431 and the upper interconnect 432. The interlayer short circuit refers to the state in which the lower interconnect 431 is short-circuited with the upper interconnect 432 via the interlayer insulating film part.

However, also as described above, the electrical characteristics of the oxide semiconductor, which is the channel material of the oxide semiconductor TFT, deteriorate when the oxygen comes out of the oxide semiconductor over time. Specifically, the electrical characteristics of the oxide semiconductor TFT change in such a direction that the electrical conductivity becomes higher. That is, the oxide semiconductor becomes closer to a conductor when the oxygen comes out of it. Furthermore, if the oxide semiconductor becomes close to a conductor, the oxide semiconductor layer 435 is electrically short-circuited with the upper interconnect (power supply line) 432 at the interconnect intersection part P. This phenomenon will be specifically described below.

Due to the stacking of the oxide semiconductor layer 435 as the channel layer of the oxide semiconductor TFT over the lower interconnect 431 with the intermediary of the gate insulating film 434, a rising part $435_A$ corresponding to the thickness of the lower interconnect 431 is formed at the peripheral part of the oxide semiconductor layer 435 as shown in FIG. 9C. Furthermore, forming the upper interconnect 432 over the oxide semiconductor layer 435 with the intermediary of the channel protective film 436 leads to the state in which the oxide semiconductor layer 435 is in contact with the upper interconnect 432 at the outer circumferential surface of its rising part $435_A$.

In this state, when the oxide semiconductor of the oxide semiconductor layer 435 becomes close to a conductor due to removal of the oxygen over time, the oxide semiconductor layer 435 is electrically short-circuited with the upper interconnect 432 at the outer circumferential surface of the rising part $435_A$. Then, the oxide semiconductor layer 435 itself and the channel protective film 436 between the oxide semiconductor layer 435 and the upper interconnect 432 become nonfunctional as the interlayer insulating film, and only the gate insulating film 434 between the oxide semiconductor layer 435 and the lower interconnect 431 functions as the interlayer insulating film.

Figure 10A:
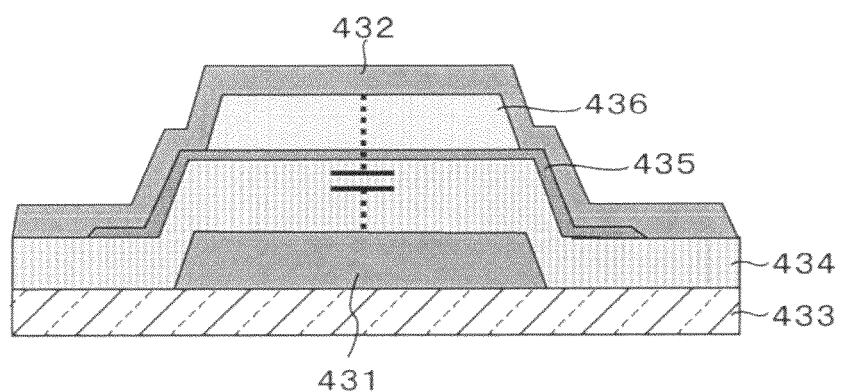
FIGS. 10A and 10B are explanatory diagrams about an interlayer insulating film between interconnects at the interconnect intersection part according to the related-art example.
Figure 10B:
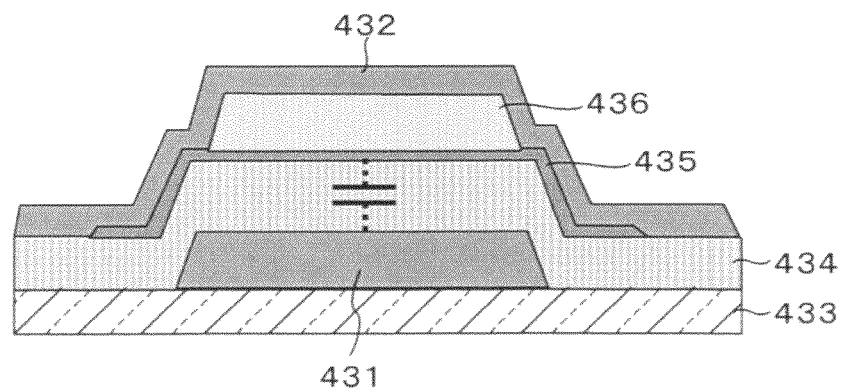

Specifically, as shown in FIGS. 10A and 10B, in electrical state (A) before removal of the oxygen of the oxide semiconductor layer 435, the gate insulating film 434, the oxide semiconductor layer 435, and the channel protective film 436 function as the interlayer insulating film. That is, the gate insulating film 434, the oxide semiconductor layer 435, and the channel protective film 436 serve as a dielectric body and capacitance is formed between the lower interconnect 431 and the upper interconnect 432.

In contrast, in electrical state (B) after removal of the oxygen of the oxide semiconductor layer 435, only the gate insulating film 434 functions as the interlayer insulating film. That is, only the gate insulating film 434 serves as a dielectric body and capacitance is formed between the lower interconnect 431 and the oxide semiconductor layer 435.

Due to this phenomenon that the oxide semiconductor layer 435 and the channel protective film 436 become non-functional as the interlayer insulating film, the breakdown voltage between the lower interconnect 431 and the upper interconnect 432 at the interconnect intersection part P is lowered. Furthermore, the lowering of the breakdown voltage between the lower interconnect 431 and the upper interconnect 432 contributes to erroneous operation of the drive circuit parts such as the write scan circuit 40, the power supply scan circuit 50, and the signal output circuit 60.

Embodiments of the present disclosure are provided in order to prevent the lowering of the breakdown voltage in association with change in the characteristics of the oxide semiconductor over time at the interconnect intersection part P for use of a thin film transistor including the oxide semiconductor as its channel material. Specific embodiments for realizing that will be described below.

2. First Embodiment

An organic EL display device according to a first embodiment of the present disclosure employs the same system configuration as that of the organic EL display device 10 shown in FIG. 1, and has circuit parts including a thin film transistor using an oxide semiconductor as its channel material (oxide semiconductor TFT). Specific examples of the circuit part include drive circuit parts to drive the respective pixels 20 of the pixel array part 30, i.e. the write scan circuit 40, the power supply scan circuit 50, and the signal output circuit 60.

As the transistor configuring these circuit parts, a thin film transistor including an oxide semiconductor as its channel material (oxide semiconductor TFT) can be used. Due to this feature, the circuit parts using the oxide semiconductor TFT, i.e. the write scan circuit 40, the power supply scan circuit 50, and the signal output circuit 60, can be mounted on the same substrate as that of the pixel array part 30, i.e. on the display panel 70.

These circuit parts have the lower interconnect 431 formed in the same process as that of the gate electrode of the oxide semiconductor TFT and the upper interconnect 432 intersecting the lower interconnect 431, similarly to the structure shown in FIG. 9A. Furthermore, an interlayer insulating film is interposed between the lower interconnect 431 and the upper interconnect 432 and thereby electrical insulation between the lower interconnect 431 and the upper interconnect 432 is achieved.

In the organic EL display device according to the first embodiment, the interlayer insulating film at the interconnect intersection part P includes the oxide semiconductor layer 435 and the channel protective film 436 stacked over the lower interconnect 431 with the intermediary of the gate insulating film 434 in the same processes as those of the channel layer and channel protective layer of the oxide semiconductor TFT. In the present embodiment, in the interlayer insulating film at the interconnect intersection part P, the channel protective film 436 is interposed between the upper interconnect 432 and the outer circumferential surface of the rising part $435_A$ (see FIG. 9C of the oxide semiconductor layer 435 corresponding to the thickness of the lower interconnect 431.

Due to this intermediary of the channel protective film 436 between the outer circumferential surface of the rising part $435_A$ of the oxide semiconductor layer 435 and the upper interconnect 432, the oxide semiconductor layer 435 is not electrically short-circuited with the upper interconnect 432 even when the electrical characteristics of the oxide semiconductor deteriorate. That is, the interlayer insulating film at the interconnect intersection part P is free from the problem of the deterioration of the electrical characteristics attributed to change in the characteristics of the oxide semiconductor layer 435 over time. Therefore, at the interconnect intersection part P, the lowering of the breakdown voltage between the lower and upper interconnects 431 and 432 can be suppressed.

A description will be made below about specific form examples of the structure of the interconnect intersection part P according to the first embodiment when the interlayer insulating film includes the oxide semiconductor layer 435.

2-1. Form Example 1

Figure 11A:
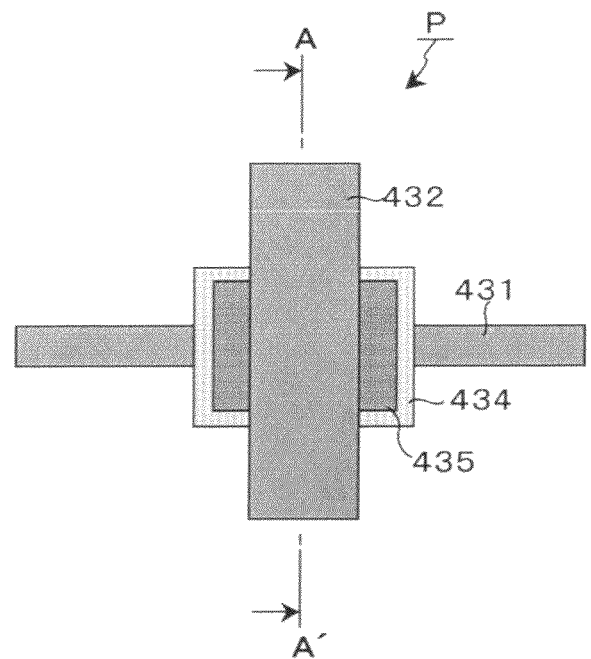
FIGS. 11A and 11B are explanatory diagrams about the interlayer insulating film between interconnects at the interconnect intersection part according to form example 1 of a first embodiment of the present disclosure.
Figure 11B:
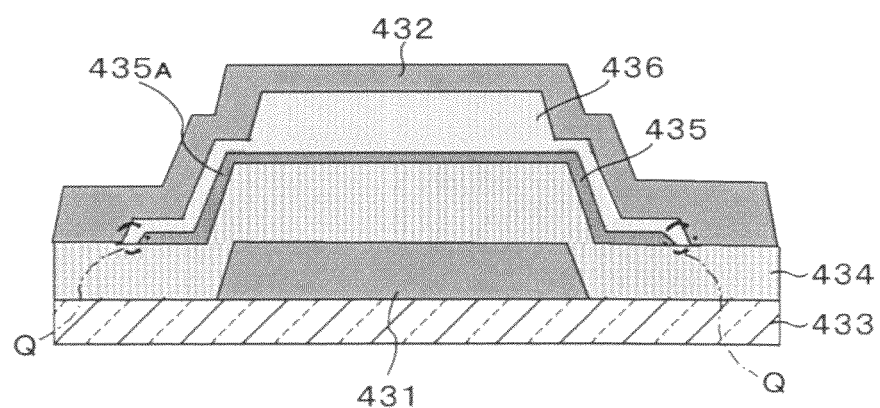

FIGS. 11A and 11B are explanatory diagrams about the interlayer insulating film between interconnects at the interconnect intersection part according to form example 1 of the first embodiment. FIG. 11A shows an enlarged planar pattern of the interconnect intersection part. FIG. 11B shows a section along line A-A' in FIG. 11A. In FIGS. 11A and 11B, a part equivalent to that in FIGS. 9A to 9C is given the same numeral.

Referring to FIGS. 11A and 11B, the lower interconnect (e.g. signal line) 431 is formed on the substrate 433 by a metal interconnect of e.g. molybdenum (Mo) in the same process as that of the gate electrode of the oxide semiconductor TFT included in the circuit part. The gate insulating film 434 is formed on the lower interconnect 431 in the same process as that of the oxide semiconductor TFT. The oxide semiconductor layer 435 is formed as the channel layer on the gate insulating film 434 and the channel protective film 436 is formed on the oxide semiconductor layer 435.

That is, the oxide semiconductor layer 435 and the channel protective film 436 are sequentially stacked over the lower interconnect 431 with the intermediary of the gate insulating film 434 in the same processes as those of the oxide semiconductor TFT. The insulating film 434, the oxide semiconductor layer 435, and the channel protective film 436 form the interlayer insulating film. Due to the stacking of the oxide semiconductor layer 435 with the intermediary of the gate insulating film 434, the rising part $435_A$ corresponding to the thickness of the lower interconnect 431 is formed at the peripheral part of the oxide semiconductor layer 435.

The upper interconnect (e.g. power supply line) 432 is formed on the channel protective film 436 by a metal interconnect of e.g. aluminum (Al). The channel protective film 436 is interposed between the outer circumferential surface of the rising part $435_A$ of the oxide semiconductor layer 435 and the inner circumferential surface of the upper interconnect 432. The peripheral end Q of the oxide semiconductor layer 435 is electrically insulated from the upper interconnect 432. That is, the channel protective film 436 is interposed also between the peripheral end Q of the oxide semiconductor layer 435 and the inner circumferential surface of the upper interconnect 432.

As described above, the gate insulating film 434, the oxide semiconductor layer 435, and the channel protective film 436 are stacked between the lower interconnect 431 and the upper interconnect 432. Thereby, the film thickness of the interlayer insulating film is set large to prevent interlayer short circuit between the lower interconnect 431 and the upper interconnect 432. In addition, the interconnect intersection part according to this form example 1 employs a structure in which the channel protective film 436 is interposed between the outer circumferential surface and the peripheral end Q of the rising part $435_A$ of the oxide semiconductor layer 435 and the inner circumferential surface of the upper interconnect 432.

Because this structure is employed, the oxide semiconductor layer 435 is not electrically short-circuited with the upper interconnect 432 at its outer circumferential surface even when the oxide semiconductor of the oxide semiconductor layer 435 becomes close to a conductor due to the deterioration of the electrical characteristics attributed to removal of the oxygen over time. That is, the interlayer insulating film at the interconnect intersection part P is free from the problem of the deterioration of the electrical characteristics attributed to change in the characteristics of the oxide semiconductor over time. Therefore, at the'interconnect intersection part P, the breakdown voltage between the lower and upper interconnects 431 and 432 is not lowered.

2-2. Form Example 2

Figure 12A:
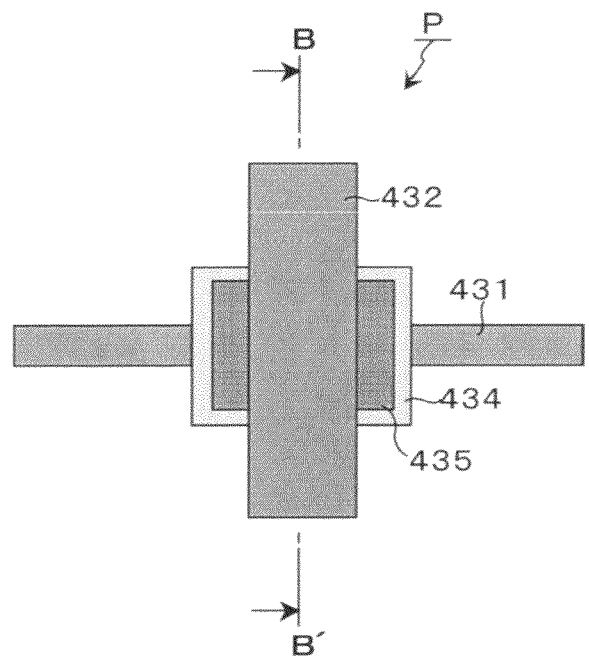
FIGS. 12A and 12B are explanatory diagrams about the interlayer insulating film between interconnects at the interconnect intersection part according to form example 2 of the first embodiment.
Figure 12B:
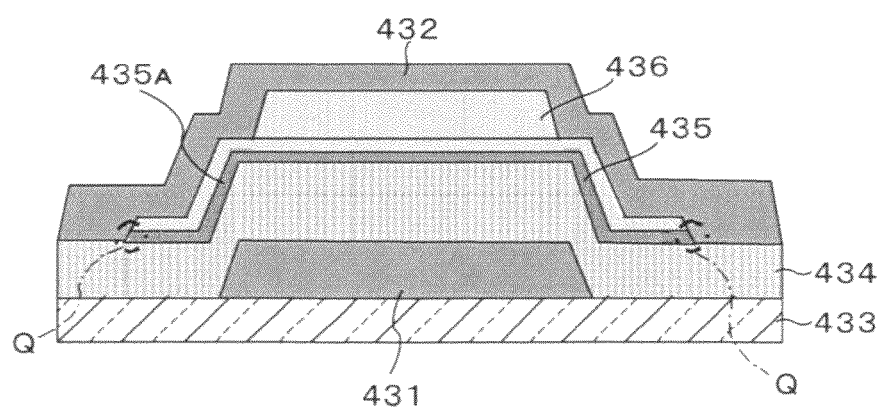

FIGS. 12A and 12B are explanatory diagrams about the interlayer insulating film between interconnects at the interconnect intersection part according to form example 2 of the first embodiment. FIG. 12A shows an enlarged planar pattern of the interconnect intersection part. FIG. 12B shows a section along line B-B' in FIG. 12A. In FIGS. 12A and 12B, a part equivalent to that in FIGS. 9A to 9C is given the same numeral.

The structure of the interconnect intersection part according to form example 2 is basically similar to that of the interconnect intersection part according to form example 1 as is apparent from comparison between FIG. 11 and FIG. 12. Specifically, the gate insulating film 434, the oxide semiconductor layer 435, and the channel protective film 436 are stacked between the lower interconnect 431 and the upper interconnect 432. Thereby, the film thickness of the interlayer insulating film is set large to prevent interlayer short circuit between the lower interconnect 431 and the upper interconnect 432.

Furthermore, the structure of the interconnect intersection part according to form example 2 is the same as that of the interconnect intersection part according to form example 1 also in that the channel protective film 436 is interposed between the outer circumferential surface of the rising part $435_A$ of the oxide semiconductor layer 435 and the inner circumferential surface of the upper interconnect 432. However, in the interconnect intersection part according to form example 2, the peripheral end Q of the oxide semiconductor layer 435 is electrically short-circuited with the upper interconnect 432. In this point, its structure is different from that of the interconnect intersection part according to form example 1, in which the peripheral end Q is electrically insulated.

The film thickness of the peripheral end Q of the oxide semiconductor layer 435 (it is also the film thickness of the oxide semiconductor layer 435) is about 1/10 of the thickness of the lower interconnect 431 (interconnect thickness), i.e. the height of the rising part $435_A$ of the oxide semiconductor layer 435. Specifically, the thickness of the lower interconnect 431 is about 200 to 300 nm. In contrast, the film thickness of the peripheral end Q of the oxide semiconductor layer 435 is about 20 to 30 nm. This means that the contact area of the peripheral end Q of the oxide semiconductor layer 435 to the inner circumferential surface of the upper interconnect 432 is about 1/10 of the area of the outer circumferential surface of the rising part $435_A$.

It has been confirmed that, because the contact area of the peripheral end Q of the oxide semiconductor layer 435 to the inner circumferential surface of the upper interconnect 432 is very small as just described, operation and effect close to those of the structure of the interconnect intersection part according to form example 1 are obtained although the peripheral end Q is electrically short-circuited with the inner circumferential surface of the upper interconnect 432. That is, although the peripheral end Q of the oxide semiconductor layer 435 is electrically short-circuited with the upper interconnect 432, its contact area is very small and thus the influence of the deterioration of the electrical characteristics attributed to change in the characteristics of the oxide semiconductor over time is small. Therefore, at the interconnect intersection part P, the lowering of the breakdown voltage between the lower and upper interconnects 431 and 432 can be suppressed.

Although the influence of the deterioration of the electrical characteristics attributed to change in the characteristics of the oxide semiconductor over time is small, form example 2 is slightly inferior to form example 1 in terms of the deterioration of the electrical characteristics. However, in the case of form example 1, the peripheral end Q of the oxide semiconductor layer 435 needs to be electrically insulated from the upper interconnect 432 and therefore a step of removing the peripheral end Q after stacking the oxide semiconductor layer 435 is necessary.

In the case of stacking the oxide semiconductor layer 435 and then removing its peripheral end Q, the manufacturing process is more complex compared with the case in which removing the peripheral end Q is unnecessary. Therefore, if the disadvantage that the manufacturing process becomes more complex is considered, it can be said that form example 2, whose manufacturing process is substantially the same as that of the related-art structure, is more preferable than form example 1 although being slightly inferior to form example 1 in terms of the deterioration of the electrical characteristics.

3. Second Embodiment

An organic EL display device according to a second embodiment of the present disclosure also employs the same system configuration as that of the organic EL display device 10 shown in FIG. 1. Furthermore, the configuration of the circuit parts including a thin film transistor using an oxide semiconductor as its channel material is also basically the same as that in the organic EL display device according to the first embodiment.

Figure 13A:
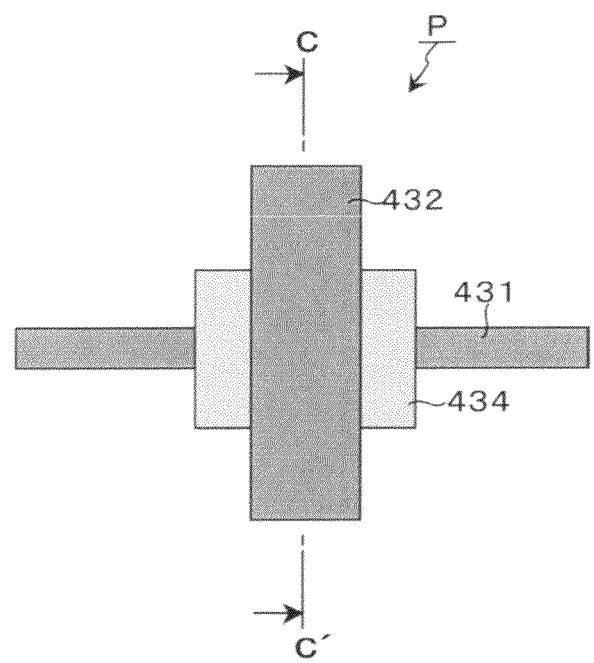
FIGS. 13A and 13B are explanatory diagrams about the interlayer insulating film between interconnects at the interconnect intersection part according to a second embodiment of the present disclosure.
Figure 13B:
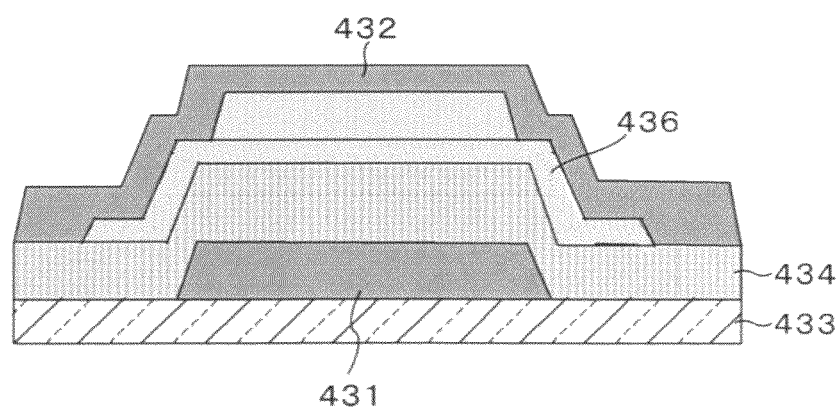

FIGS. 13A and 13B are explanatory diagrams about the interlayer insulating film between interconnects at the interconnect intersection part according to the second embodiment. FIG. 13A shows an enlarged planar pattern of the interconnect intersection part. FIG. 13B shows a section along line C-C' in FIG. 13A. In FIGS. 13A and 13B, a part equivalent to that in FIGS. 9A to 9C is given the same numeral.

In the organic EL display device according to the second embodiment, the interlayer insulating film at the interconnect intersection part P has a structure that does not include the oxide semiconductor layer 435. Specifically, the interlayer insulating film at the interconnect intersection part P according to the second embodiment has a structure obtained by removing the oxide semiconductor layer 435 stacked over the lower interconnect 431 with the intermediary of the gate insulating film 434 in the same process as that of the channel layer of the oxide semiconductor TFT after stacking the oxide semiconductor layer 435. The reason why the oxide semiconductor layer 435 to be removed is stacked is because the interlayer insulating film at the interconnect intersection part P is formed in the same process as that of the channel layer of the oxide semiconductor TFT.

Because the interlayer insulating film at the interconnect intersection part P does not include the oxide semiconductor layer 435, the gate insulating film 434 and the channel protective film 436 are interposed as the interlayer insulating film between the lower interconnect 431 and the upper interconnect 432. Therefore, in the interlayer insulating film at the interconnect intersection part P, the problem of the deterioration of the electrical characteristics attributed to change in the characteristics of the oxide semiconductor layer 435 over time does not occur at all. Therefore, the breakdown voltage between the lower and upper interconnects 431 and 432 is not lowered at the interconnect intersection part P.

When the second embodiment is compared with form examples 1 and 2 of the first embodiment, in the second embodiment, the film thickness of the interlayer insulating film is smaller by the film thickness of the oxide semiconductor layer 435 because the oxide semiconductor layer 435 is not included in the interlayer insulating film. Therefore, the second embodiment is slightly inferior to form examples 1 and 2 of the first embodiment in terms of the breakdown voltage between the lower and upper interconnects 431 and 432 although the problem of the deterioration of the electrical characteristics attributed to change in the characteristics of the oxide semiconductor layer 435 over time does not occur at all.

In addition, photolithography etching needs to be performed after the oxide semiconductor layer 435 is formed in order to obtain the layout configuration of the interlayer insulating film according to the second embodiment, i.e. remove the oxide semiconductor layer 435 after forming it (details will be later in description of the manufacturing process). If photolithography etching is performed after the oxide semiconductor layer is formed in the same process as that of the oxide semiconductor TFT, damage is left on the surface of the oxide semiconductor layer in some cases.

This problem that damage is left on the surface of the oxide semiconductor layer applies also to the oxide semiconductor TFT formed in the same process as that of the interconnect intersection part P. Therefore, sufficient transistor characteristics are not obtained regarding the oxide semiconductor TFT. That is, in the second embodiment, compared with the first embodiment, possibly adverse effect is brought to the transistor characteristics of the oxide semiconductor TFT in the course of the manufacturing process although the problem of the deterioration of the electrical characteristics attributed to change in the characteristics of the oxide semiconductor layer 435 over time does not occur at all.

4. Manufacturing Process

Manufacturing processes about the interlayer insulating film at the interconnect intersection part P according to the first and second embodiments will be described below. In the following, the manufacturing process of the interlayer insulating film according to form example 2 of the first embodiment will be described as manufacturing process 1, and the manufacturing process of the interlayer insulating film according to the second embodiment will be described as manufacturing process 2.

4-1. Manufacturing Process 1

FIG. 14 is a step diagram showing a step flow about the manufacturing process of the interlayer insulating film according to form example 2 of the first embodiment. In FIG. 14, a part equivalent to that in FIGS. 9A to 9C is given the same numeral.

First, the lower interconnect 431 and the gate insulating film (interlayer insulating film) 434 of the interconnect intersection part P are formed over the substrate 433 in the same processes as those of the gate electrode and gate insulating film of the oxide semiconductor TFT included in the circuit part (step 1). Next, the oxide semiconductor layer 435 is formed by physical vapor deposition (PVD) (step 2) and then the channel protective film 436 is formed by e.g. chemical vapor deposition (CVD) (step 3).

Next, a photoresist 511 is spin-coated (step 4) and then the photoresist 511 is subjected to exposure and development to be pattern-formed into the shape corresponding to the peripheral end Q of the oxide semiconductor layer 435 shown in FIG. 12B (step 5). Thereafter, the channel protective film 436 is etched by using the photoresist 511 as the mask (step 6). Subsequently, the photoresist 511 is removed (step 7) and then a photoresist 512 is spin-coated (step 8).

Next, the photoresist 512 is subjected to exposure and development to be pattern-formed into the shape corresponding to the outer shape of the channel protective film 436 (step 9). Subsequently, the unnecessary part of the oxide semiconductor layer 435 is chemically removed by photolithography etching, e.g. wet etching, with use of the photoresist 512 as the mask (step 10). Next, the photoresist 512 is removed (step 11) and thereafter the upper interconnect 432, a contact part of the oxide semiconductor TFT, and so forth are formed (step 12).

In the above-described manufacturing process, the unnecessary part of the oxide semiconductor layer 435 is removed by using the photoresist 512 having the shape corresponding to the outer shape of the channel protective film 436 as the mask. Therefore, the peripheral end Q of the oxide semiconductor layer 435 is disposed at the same outer circumferential position as that of the peripheral end of the channel protective film 436. Due to this structure, the oxide semiconductor layer 435 is in contact with the upper interconnect 432 at its peripheral end Q. However, also as described above, the film thickness of the oxide semiconductor layer 435 is as small as about 20 to 30 nm and therefore the influence of the contact is very small compared with the related-art structure, in which the oxide semiconductor layer 435 is in contact with the upper interconnect 432 at the rising part $435_A$.

In the manufacturing process of the related-art structure, in which the oxide semiconductor layer 435 is in contact with the upper interconnect 432 at the rising part $435_A$, in step 5, the photoresist 511 is pattern-formed into a shape within the range of the top surface of the convex part of the channel protective film 436. Therefore, it can be said that the manufacturing process of the interlayer insulating film according to form example 2 of the first embodiment is substantially the same as the manufacturing process of the related-art structure. In contrast, the manufacturing process of the interlayer insulating film according to form example 1 of the first embodiment is more complex than the manufacturing process of the interlayer insulating film according to form example 2 of the first embodiment because of addition of the step of removing the peripheral end Q of the oxide semiconductor layer 435.

4-2. Manufacturing Process 2

Figure 15:
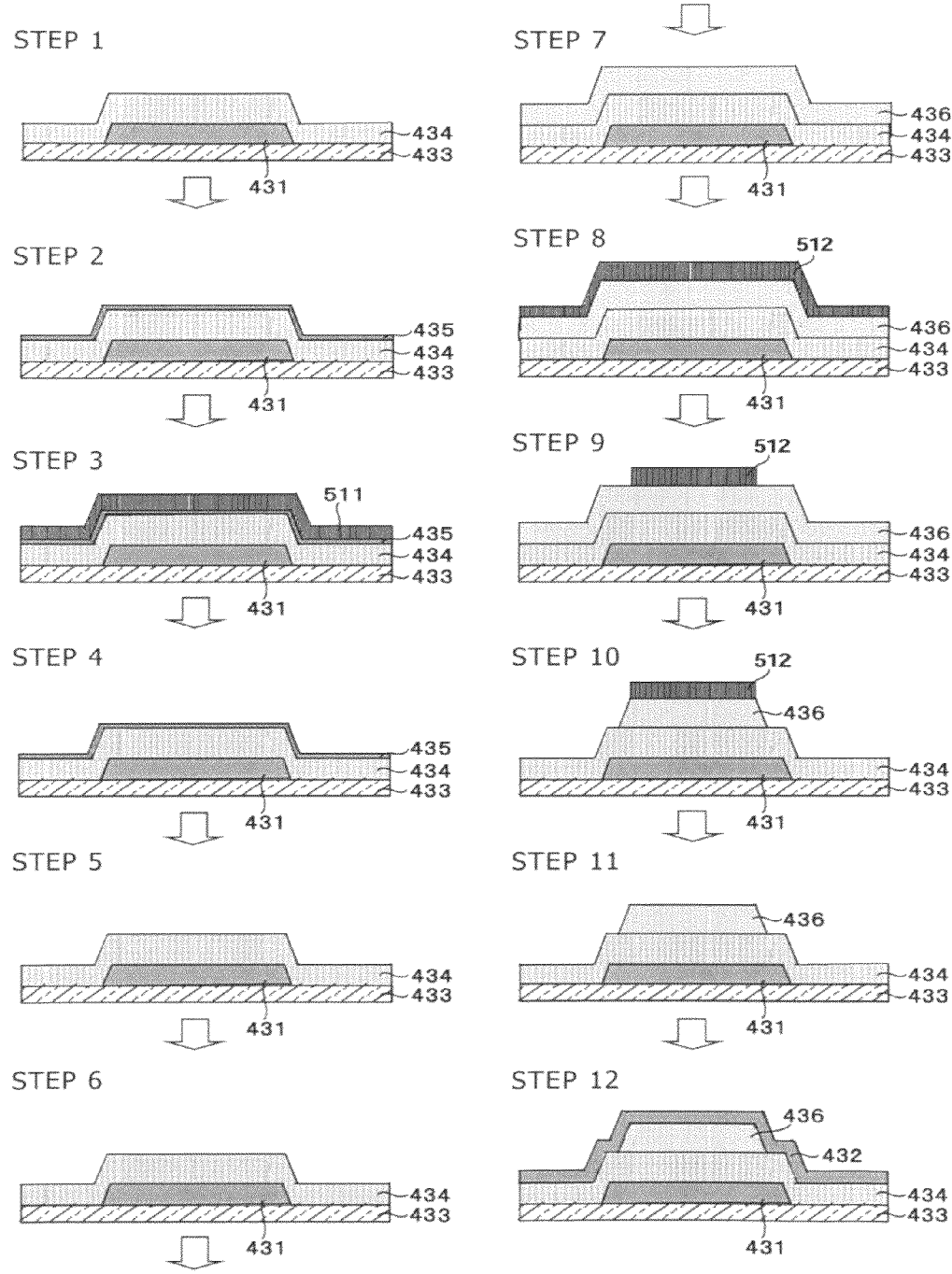
FIG. 15 is a step diagram showing a step flow about the manufacturing process of the interlayer insulating film according to the second embodiment.

FIG. 15 is a step diagram showing a step flow about the manufacturing process of the interlayer insulating film according to the second embodiment. In FIG. 15, a part equivalent to that in FIG. 14 is given the same numeral.

First, the lower interconnect 431 and the gate insulating film (interlayer insulating film) 434 of the interconnect intersection part P are formed over the substrate 433 in the same processes as those of the gate electrode and gate insulating film of the oxide semiconductor TFT included in the circuit part (step 1). Next, the oxide semiconductor layer 435 is formed by physical vapor deposition (PVD) (step 2).

Next, the photoresist 511 is spin-coated (step 3) and then the photoresist 511 is subjected to exposure and development (step 4). This step of exposure and development is a step for forming the oxide semiconductor TFT. Subsequently, the oxide semiconductor layer 435 is chemically removed by photolithography etching, e.g. wet etching (step 5) and then the photoresist 511 in the area of the oxide semiconductor TFT is removed (step 6).

Next, the channel protective film 436 is formed on the gate insulating film 434 by e.g. CVD (step 7) and then the photoresist 512 is spin-coated (step 8). Next, the photoresist 512 is subjected to exposure and development to be pattern-formed (step 9) and thereafter the channel protective film 436 is etched by using the photoresist 512 as the mask (step 10). Subsequently, the photoresist 512 is removed (step 11) and thereafter the upper interconnect 432, a contact part of the oxide semiconductor TFT, and so forth are formed (step 12).

By the above-described manufacturing process, the interconnect intersection part P according to the second embodiment, at which the oxide semiconductor layer 435 is not included in the interlayer insulating film, can be formed. Also as described above, the interconnect intersection part P according to the second embodiment is free from the problem of the deterioration of the electrical characteristics attributed to change in the characteristics of the oxide semiconductor layer 435 over time. Thus, the interconnect intersection part P according to the second embodiment is more excellent than the interconnect intersection part P according to form examples 1 and 2 of the first embodiment in terms of the deterioration of the electrical characteristics.

However, photolithography etching is performed in step 5 in order to remove the oxide semiconductor layer 435 after forming it, as is apparent from the above-described manufacturing process. If photolithography etching is performed after the oxide semiconductor layer is formed in the same process as that of the oxide semiconductor TFT in this manner, damage is left on the surface of the oxide semiconductor layer 435 in some cases. As a result, sufficient transistor characteristics are not obtained regarding the oxide semiconductor TFT.

5. Modification Example

The above description is made by taking as an example the case of applying, to a display device, a technical idea for solving the problem of the lowering of the breakdown voltage between upper and lower interconnects in association with change in the characteristics of an oxide semiconductor over time. However, embodiments of the present disclosure are not limited to application to a display device and can be applied to the overall devices using an oxide semiconductor.

Furthermore, although an organic EL display device using an oxide semiconductor TFT is taken as an example of the display device to which an embodiment of the present disclosure is applied, embodiments of the present disclosure are not limited to this application example. Specifically, embodiments of the present disclosure can be applied to, besides the organic EL display device, the overall display devices using inorganic EL element, LED element, semiconductor laser element, and so forth as an electrooptical element, particularly the overall display devices using an oxide semiconductor TFT.

6. Electronic Apparatus

The display device according to the above-described embodiment of the present disclosure can be applied to a display part (display device) of electronic apparatus in every field that displays a video signal input to the electronic apparatus or a video signal generated in the electronic apparatus as image or video. As one example, embodiments of the present disclosure can be applied to display parts of various pieces of electronic apparatus shown in FIG. 16 to FIG. 20G, specifically e.g. digital camera, notebook personal computer, portable terminal device such as a cellular phone, and video camcorder.

By using the display device according to the embodiment of the present disclosure as the display part of electronic apparatus in every field in this manner, the reliability of various kinds of electronic apparatus can be enhanced. Specifically, as is apparent from the above description of the respective embodiments, the display device according to the embodiment of the present disclosure can suppress the lowering of the breakdown voltage between upper and lower interconnects at the interconnect intersection part in association with change in the characteristics of the oxide semiconductor over time and thus can suppress erroneous operation of the circuit part. Therefore, the operation of the drive circuit part of the display device can be ensured in various kinds of electronic apparatus and thus the display device according to the embodiment of the present disclosure can contribute to enhancement in the reliability of the electronic apparatus.

The display device according to the embodiment of the present disclosure includes also a display device having a module shape based on a sealed configuration. Examples of such a display device include a display module formed by applying an opposed part such as transparent glass to a pixel array part. This transparent opposed part may be provided with a color filter, a protective film, etc. The display module may be provided with a circuit part, a flexible printed circuit (FPC), etc. for input/output of a signal and so forth from the external to the pixel array part.

Specific examples of the electronic apparatus to which the embodiment of the present disclosure is applied will be described below.

Figure 16:
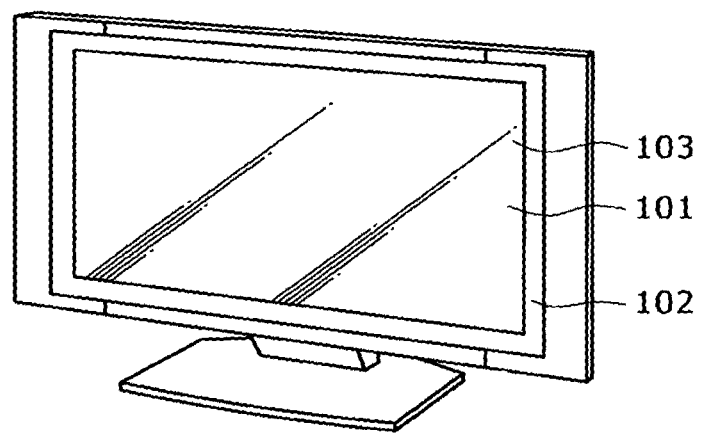
FIG. 16 is a perspective view showing the appearance of a television set to which the embodiment of the present disclosure is applied.

FIG. 16 is a perspective view showing the appearance of a television set to which the embodiment of the present disclosure is applied. The television set according to the present application example includes a video display screen part 101 composed of a front panel 102, a filter glass 103, etc. and is fabricated by using the display device according to the embodiment of the present disclosure as the video screen display part 101.

Figure 17A:
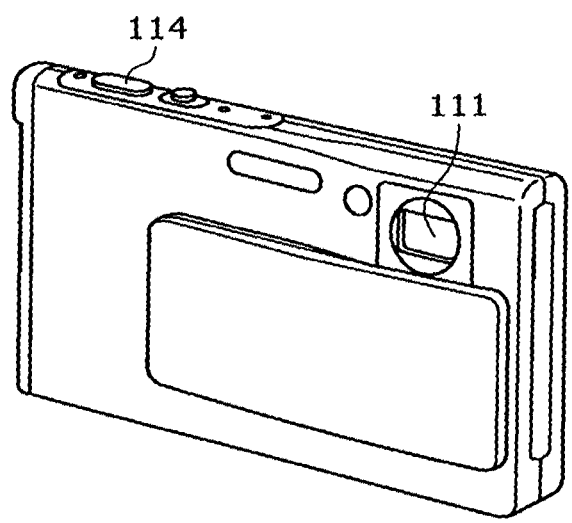
FIGS. 17A and 17B are perspective views showing the appearance of a digital camera to which the embodiment of the present disclosure is applied.
Figure 17B:
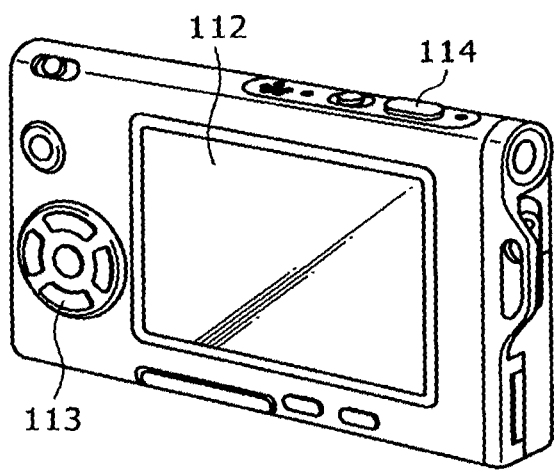

FIGS. 17A and 17B are perspective views showing the appearance of a digital camera to which the embodiment of the present disclosure is applied. FIG. 17A is a perspective view of the front side and FIG. 17B is a perspective view of the back side. The digital camera according to the present application example includes a light emitter 111 for flash, a display part 112, a menu switch 113, a shutter button 114, etc. and is fabricated by using the display device according to the embodiment of the present disclosure as the display part 112.

Figure 18:
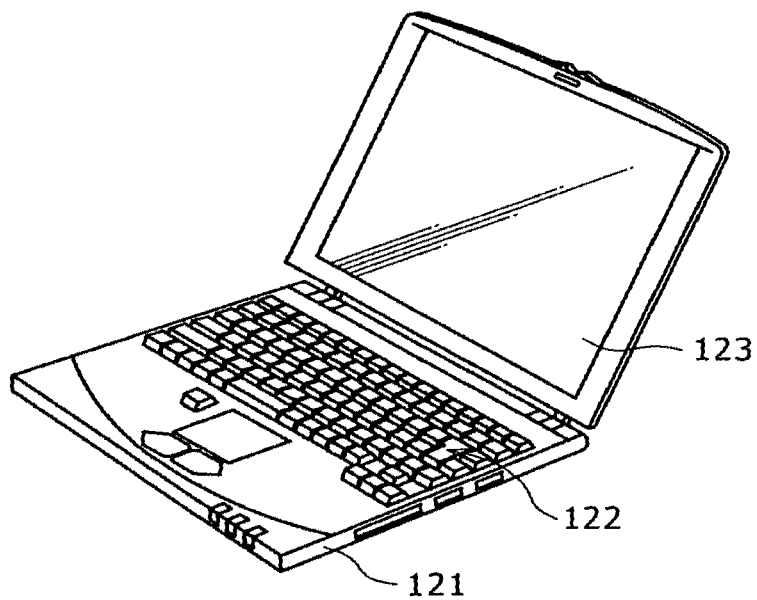
FIG. 18 is a perspective view showing the appearance of a notebook personal computer to which the embodiment of the present disclosure is applied.

FIG. 18 is a perspective view showing the appearance of a notebook personal computer to which the embodiment of the present disclosure is applied. The notebook personal computer according to the present application example includes, in its main body 121, a keyboard 122 operated when characters and so forth are input, a display part 123 that displays images, etc. and is fabricated by using the display device according to the embodiment of the present disclosure as the display part 123.

Figure 19:
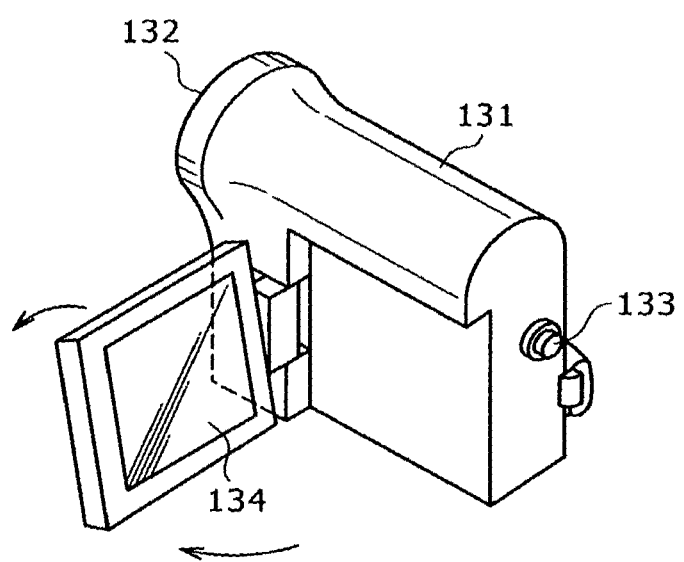
FIG. 19 is a perspective view showing the appearance of a video camcorder to which the embodiment of the present disclosure is applied.

FIG. 19 is a perspective view showing the appearance of a video camcorder to which the embodiment of the present disclosure is applied. The video camcorder according to the present application example includes a main body part 131, a lens 132 that exists on the front side and used for subject photographing, a start/stop switch 133 about photographing, a display part 134, etc. and is fabricated by using the display device according to the embodiment of the present disclosure as the display part 134.

FIGS. 20A to 20G are appearance diagrams showing a cellular phone as an example of a portable terminal device to which the embodiment of the present disclosure is applied: FIG. 20A is a front view of the opened state, FIG. 20B is a side view of the opened state, FIG. 20C is a front view of the closed state, FIG. 20D is a left side view, FIG. 20E is a right side view, FIG. 20F is a top view, and FIG. 20G is a bottom view. The cellular phone according to the present application example includes an upper chassis 141, a lower chassis 142, a connecting part (in this example, hinge part) 143, a display 144, a sub-display 145, a picture light 146, a camera 147, etc. The cellular phone according to the present application example is fabricated by using the display device according to the embodiment of the present disclosure as the display 144 and the sub-display 145.

The present disclosure contains subject matter related to that disclosed in Japanese Priority Patent Application JP 2010-276939 filed in the Japan Patent Office on Dec. 13, 2010, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:

1. A device using an oxide semiconductor, the device comprising:
   a circuit part configured to include a thin film transistor using the oxide semiconductor as a channel material and at least one wiring intersection portion,
   wherein the wiring intersection portion has an interlayer insulating film between a lower interconnect and an upper interconnect, the upper interconnect intersecting the lower interconnect,
   wherein the interlayer insulating film includes an oxide semiconductor layer and a channel protective layer, the oxide semiconductor layer and the channel protective layer being stacked over the lower interconnect with intermediary of a gate insulating film, and
   wherein the channel protective layer is interposed between an outer circumferential surface of a rising part of the oxide semiconductor layer corresponding to thickness of the lower interconnect and the upper interconnect.

2. The device using an oxide semiconductor according to claim 1, wherein a peripheral end of the oxide semiconductor layer is electrically short-circuited with the upper interconnect.

3. The device using an oxide semiconductor according to claim 2, wherein the peripheral end of the oxide semiconductor layer exists at the same outer circumferential position as an outer circumferential position of a peripheral end of the channel protective layer.

4. The device using an oxide semiconductor according to claim 1, wherein a peripheral end of the oxide semiconductor layer is electrically insulated from the upper interconnect.

5. A device using an oxide semiconductor, the device comprising:
   a circuit part configured to include a thin film transistor using the oxide semiconductor as a channel material,
   wherein the circuit part has an interlayer insulating film between a lower interconnect and an upper interconnect, the upper interconnect intersecting the lower interconnect, and
   wherein the interlayer insulating film is over the lower interconnect with intermediary of a gate insulating film.

6. A device using an oxide semiconductor, the device comprising:
   a circuit part configured to include a thin film transistor and at least one wiring intersection portion,
   wherein the wiring intersection portion has an interlayer insulating film between a lower interconnect and an upper interconnect, the upper interconnect intersecting the lower interconnect, and
   wherein the interlayer insulating film includes an oxide semiconductor layer and a protective layer, the oxide semiconductor layer and the protective layer being stacked over the lower interconnect with intermediary of a gate insulating film, and
   wherein the protective layer is interposed between an outer circumferential surface of a rising part of the oxide semiconductor layer and the upper interconnect.

7. A display device comprising:
   a pixel array part configured to be formed by arranging pixels each including an electrooptical element; and
   a circuit part configured to include a thin film transistor using an oxide semiconductor as a channel material and at least one wiring portion,
   wherein the wiring portion has an interlayer insulating film between a lower interconnect and a upper interconnect, the upper interconnect intersecting the lower interconnect, and
   wherein the interlayer insulating film includes an oxide semiconductor layer and a channel protective layer, the oxide semiconductor layer and the channel protective layer being stacked over the lower interconnect with intermediary of a gate insulating film, and
   wherein the channel protective layer is interposed between an outer circumferential surface of a rising part of the oxide semiconductor layer corresponding to thickness of the lower interconnect and the upper interconnect.

8. The display device according to claim 7, wherein the circuit part is mounted on the same substrate as a substrate of the pixel array part.

9. A display device comprising:
   a pixel array part configured to be formed by arranging pixels each including an electrooptical element; and
   a circuit part configured to include a thin film transistor using an oxide semiconductor as a channel material,
   wherein the circuit part has an interlayer insulating film between a lower interconnect and an upper interconnect, the upper interconnect intersecting the lower interconnect, and
   wherein the interlayer insulating film over the lower interconnect with intermediary of a gate insulating film.

10. The display device according to claim 9, wherein the circuit part is mounted on the same substrate as a substrate of the pixel array part.

11. Electronic apparatus having a display device comprising:
- a pixel array part configured to be formed by arranging pixels each including an electrooptical element; and
- a circuit part configured to include a thin film transistor using an oxide semiconductor as a channel material and at least one wiring intersection portion,
- wherein the wiring intersection portion has an interlayer insulating film between a lower interconnect and an upper interconnect, the upper interconnect intersecting the lower interconnect, and
- wherein the interlayer insulating film includes an oxide semiconductor layer and a channel protective layer, the oxide semiconductor layer and the channel protective layer being stacked over the lower interconnect with intermediary of a gate insulating film, and
- wherein the channel protective layer is interposed between an outer circumferential surface of a rising part of the oxide semiconductor layer corresponding to thickness of the lower interconnect and the upper interconnect.

12. Electronic apparatus having a display device comprising:
- a pixel array part configured to be formed by arranging pixels each including an electrooptical element; and
- a circuit part configured to include a thin film transistor using an oxide semiconductor as a channel material,
- wherein the circuit part has an interlayer insulating film between a lower interconnect and an upper interconnect, the upper interconnect intersecting the lower interconnect, and
- wherein the interlayer insulating film is over the lower interconnect with intermediary of a gate insulating film.

\* \* \* \* \*